(12) United States Patent
Fukushima et al.

(10) Patent No.: US 6,485,831 B1
(45) Date of Patent: Nov. 26, 2002

(54) CONDUCTIVE POWDER AND MAKING PROCESS

(75) Inventors: Motoo Fukushima; Kunio Itoh; Shigeru Mori, all of Gunma-ken; Masaki Kasahima, Takefu; Yoshitaka Hamada, Gunma-ken; Mikio Aramata, Annaka, all of (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/570,696

(22) Filed: May 12, 2000

(30) Foreign Application Priority Data

| May 13, 1999 | (JP) | ............................................. 11-132501 |
| Jul. 7, 1999 | (JP) | ............................................. 11-193354 |
| Nov. 29, 1999 | (JP) | ............................................. 11-337727 |

(51) Int. Cl.$^7$ ............................ B32B 18/00; B32B 9/00; B32B 15/00
(52) U.S. Cl. ........................ 428/403; 428/404; 428/405; 428/406; 427/209; 427/219
(58) Field of Search ................................ 428/403, 212, 428/544, 404, 405, 406, 450, 448, 447; 427/212, 219, 407.1, 209

(56) References Cited

U.S. PATENT DOCUMENTS

| 4,435,189 A | * | 3/1984 | Bovenkerk | .................... 51/295 |
| 4,579,882 A | * | 4/1986 | Kanbe et al. | ................ 523/137 |
| 5,404,154 A | * | 4/1995 | Tomari et al. | ............... 347/153 |

FOREIGN PATENT DOCUMENTS

| DE | 1341598 | 6/1994 |
| EP | 0107863 | 5/1984 |
| JP | A59182961 | 10/1984 |
| JP | A60181294 | 9/1985 |
| JP | A1242782 | 9/1989 |
| JP | A11306855 | 11/1999 |

OTHER PUBLICATIONS

Handbook of Chemistry and Physics, 82$^{nd}$ edition, Aug. 28, 2001, p. 8–24.*
Machine Translation of Japanese App #10121836, Motoo et al. "Metal–Coated Powder and its Manufacture" May 11, 1999.*
Database WPI, Section Ch, Week 199746, Derwent Publications Ltd., London, GB; AN 1997–500265, XP002156986.
& JP 09 237517 A (Sony Chem Corp), Sep. 9, 1997 *abstract*.

* cited by examiner

Primary Examiner—Paul Thibodeau
Assistant Examiner—Nikolas Uhir
(74) Attorney, Agent, or Firm—Birch, Stewart, Kolasch & Birch, LLP

(57) ABSTRACT

A conductive powder having an organic silicon polymer layer on the surface of each particle and a metal layer enclosing the silicon polymer layer possesses a stronger bond between the particle base and the metal even at elevated temperature and exhibits a high and stable conductivity and heat resistance.

17 Claims, 7 Drawing Sheets

($SiO_2$–Ni–Au)

($SiO_2$-Ni-Au)

($SiO_2$-Ni-Au)

($SiO_2$–Ni–Au)

(SiO₂-Ni-Au)

(SiO₂−Ni−Au)

CONDUCTIVE POWDER AND MAKING PROCESS

This invention relates to a conductive powder having high conductivity stability even at elevated temperature and a process for preparing the same.

BACKGROUND OF THE INVENTION

When rubber and plastic articles are used in an electronic application where conductivity is often required, it is a common practice to mix conductive powder in the rubber and plastic. Metal powders such as copper powder, nickel powder and silver powder are often used as the conductive powder although they add to the weight of electronic materials because of their high specific gravity in the range of 8 to 11. This is undesirable because the electronic materials are desired to be lightweight. Carbon powders such as graphite and carbon black are also used as the conductive powder although they fail to provide electronic materials with a resistivity of $10^{-3}$ $\Omega$-cm order because of their own high resistivity.

Of the conductive powders, metallized powder particles having high conductivity which are prepared by coating insulating powder particles or low conductivity powder particles with a metal have advantages including an increased freedom of choice for the powder material serving as a nucleus. They find a wide range of application as a conductive filler or a component added to conductive adhesive and anisotropic conductive film. A number of processes have been studied for the production of such metallized powder particles, with the process of using an electroless plating solution containing a metal salt and a reducing agent being industrially used in practice. For example, by covering surfaces of glass beads with a continuous silver coat, Potters Co. developed a conductive powder exhibiting the electric properties of silver despite a low cost and a low specific gravity. As is well known in the art, this conductive powder was marked in 1978 by Toshiba Barotini K.K. and used in a variety of applications.

However, silver has the problem that it is oxidized or sulfided to increase its resistivity during long-term storage in a hot humid atmosphere. There is a desire to have a conductive powder having electric properties unsusceptible to oxidation or sulfiding like gold. With respect to the nucleus particles, glass beads are inadequate in electronic materials requiring a high degree of reliability because the glass beads contain a considerable amount of ionic metals such as Na, K, Ca, Mg and Fe in addition to $SiO_2$. The metallized glass beads have another drawback associated with working. When metallized glass beads are mixed with rubber or plastics, separation can often occur at the interface between silver and glass beads. This necessitates the use of solvents having fire hazard and the use of rubber rolls rather than metal rolls.

The separation at the interface between metal and powder particles is still the outstanding problem in the manufacture of metallized powder particles. Since the powder particles and the metal have different interfacial properties, the metal will separate from the powder particles due to changes with time or environmental changes (especially temperature changes), resulting in a reduced conductivity.

In order to prevent powder particle-metal separation and produce powder particles having a metal coating closely adhered thereto, the following processes have already been employed. For example, (1) powder particles are etched to introduce irregularities in their surface to increase the surface area for improving the metal adhesion. (2) Powder particles are treated with a silane coupling agent such as a monomeric silane, typically γ-aminopropyltriethoxysilane for improving the metal adhesion. (3) Powder particles are treated with an organic resin such as an epoxy resin for improving the metal adhesion. See JP-A 59-182961.

However, in method (1), the degradation of powder particles by etching is a problem. In method (2), powder particles will agglomerate owing to alkoxysilyl groups. In either case, no satisfactory metallized powder is obtained. In method (3), the organic resin with which powder particles are treated can be decomposed or degraded at elevated temperatures so that the conductive powder deteriorates its conductive properties. For example, where the rubber or plastic article which is required to impart conductivity is a highly heat resistant silicon polymer, that is, silicone rubber, this article cannot be used in the temperature range of 150 to 250° C., under which service the silicone rubber itself fully withstands, because the conductive properties are degraded.

SUMMARY OF THE INVENTION

An object of the invention is to provide a conductive powder having improved heat resistance, conductivity and conductivity stability and a process for preparing the same.

It has been found that by treating powder particles of silica or the like with an organic silicon polymer, especially an organic silicon polymer with reducing effect, typically having Si—Si bonds or Si—H bonds in a molecule, to cover the particle surface with a coat of the silicon polymer, treating the powder particles covered with the silicon polymer coat with a solution of a metal salt in the presence or absence of a surfactant to deposit metal colloid on the surface of the silicon polymer coat, and treating the powder particles with an electroless plating solution to deposit a coat therefrom, there are obtained metallized powder particles of the structure that particle surfaces are covered with the silicon polymer coat, on which the metal is carried and the metal coat is formed. The process is inexpensive and simple. The adhesion of the metal coat is very strong. The metallized powder particles can find use as fillers and anti-fungus agents having conductivity and catalysis.

The metal plating layer can be formed as a multilayer metal layer including a first metal layer typically of nickel and a second metal layer typically of gold overlying the first metal layer. More improvements are then made in heat resistance, conductivity and conductivity stability.

In general, organic silicon polymers are very interesting because of their heat resistance, flexibility, and thin film forming capability as well as the metallic nature and electron delocalization of silicon as compared with carbon. In particular, silicon polymers having Si—Si bonds or Si—H bonds, especially polysilanes or polysiloxanes having hydrogen atoms directly attached to silicon atoms are known as polymers having reducing effect and used in a variety of applications. It is also known that both polysilane serving as a precursor to silicon carbide ceramic material and polysiloxane serving as a precursor to silicon oxide ceramic material can be heat or otherwise treated into an insulating material having high heat resistance.

We already found that when a substrate is treated with an organic silicon polymer having reducing action and dipped in a metal ion-containing solution, metal ions are reduced on the substrate surface whereby the resulting metal colloid is carried on the substrate. While utilizing this colloid formation as a catalyst, electroless plating is effected. Then, a substrate having a metal coat firmly adhered thereto is produced.

Utilizing the above-described nature of the silicon polymer, we have developed a powder exhibiting stable conductive properties even at elevated temperatures and a process for producing the same. Electroless plating on powder particles, especially substantially ionic metal-free powder particles, is enabled by previously forming a layer of organic silicon polymer having reducing effect on the powder particles. By the electroless plating, powder particles are coated with a first metal layer and then with a second metal layer. Especially when an oxidation resistant metal is used as the second metal layer, little or no loss of conductivity occurs even at elevated temperatures. Final heat treatment results in metallized powder particles featuring a strong bond between the particle base and the metal layer. The resulting conductive powder can be compounded in heat resistant rubber such as silicone rubber without losses of its properties, so that the resulting compound is useful as a raw material for manufacturing reliable connectors and gaskets.

We have further found that by treating particles of silica or the like with an organic silicon polymer having reducing effect to form a silicon polymer layer on the particle surface, treating the particles with a solution containing a salt of a metal having a standard oxidation-reduction potential of at least 0.54 volt, thereby depositing colloid metal on the silicon polymer layer, effecting electroless nickel plating and then gold plating on the particles, there is obtained a conductive powder in which an organic silicon polymer layer, a nickel-phosphorus alloy layer, and a gold layer are formed successively on the particle surface. When the electroless nickel plating involves electroless nickel plating in a first electroless nickel plating solution having a first phosphorus reducing agent concentration, and electroless nickel plating in a second electroless nickel plating solution having a second phosphorus reducing agent concentration different from the first concentration, the resulting nickel-phosphorus alloy layer has a phosphorus content which differs between inner and outer surface regions and especially which is lower in the outer surface region than in the inner surface region. The metallized powder has a firmly bonded gold layer and high conductivity, and is heat resistant enough to prevent the plating layer from separating even in heat treatment above 200° C. The conductive powder can be compounded in silicone rubber etc., from which reliable, highly conductive rubber parts can be manufactured.

More specifically, we have found that in the manufacture of conductive powder, a nickel-phosphorus alloy layer having a high phosphorus content is more adhesive to powder particles of silica or the like whereas a nickel-phosphorus alloy layer having a low phosphorus content is more amenable to displacement plating with gold. By effecting electroless nickel plating initially at a low pH and in the presence of an excessive amount of reducing agent relative to a nickel salt concentration, the content of phosphorus in nickel can be increased to enhance the adhesion to silica. Thereafter, an aqueous solution containing a nickel salt, a complexing agent and a pH adjuster is replenished to the plating solution to raise the pH thereof whereby plating is effected in the presence of a short amount of reducing agent relative to the nickel salt concentration. The reduced phosphorus content in nickel facilitates gold plating. There is produced a conductive powder of the four layer structure consisting of particle base-silicon polymer-nickel/phosphorus alloy-gold and featuring tight adhesion therebetween.

According to a first aspect of the invention, there is provided a conductive powder in which an organic silicon polymer layer and a metal layer are successively formed on surfaces of particles. The metal layer preferably includes a first metal layer and a second metal layer.

According to a second aspect of the invention, there is provided a conductive powder in which a partially or entirely ceramic layer of organic silicon polymer and a metal layer are successively formed on surfaces of particles. The metal layer preferably includes a first metal layer and a second metal layer.

According to a third aspect of the invention, there is provided a process for preparing a conductive powder, comprising the steps of treating particles each having a surface with an organic silicon polymer having reducing effect to form a silicon polymer layer on the particle surface; treating the particles with a salt of a metal having a standard oxidation-reduction potential of at least 0.54 volt, thereby depositing a colloid of the metal on the organic silicon polymer layer; and thereafter, treating the particles with an electroless plating solution, thereby depositing a metal layer on the outermost surface of the particles.

According to a fourth aspect of the invention, there is provided a process for preparing a conductive powder, comprising the steps of:

(1) treating particles each having a surface with an organic silicon polymer having reducing effect to form an organic silicon polymer layer on the particle surface, (2) treating the particles with a solution containing a salt of a metal having a standard oxidation-reduction potential of at least 0.54 volt, thereby depositing a colloid of the metal on the organic silicon polymer layer, (3) effecting electroless plating on the particles with the metal colloid serving as a catalyst, to deposit a first metal layer on the outer surface of the organic silicon polymer layer, and (4) effecting plating on the particles to form a second metal layer on the first metal layer.

The process may further include the step of heat treating the particles covered with the metal layer at a temperature of at least 150° C. for converting at least a part of the organic silicon polymer into a ceramic.

In one preferred embodiment, the first metal layer is selected from among nickel, copper, silver, cobalt, tungsten, iron and zinc, and the second metal layer is selected from among gold, platinum, and palladium. More preferably, the first metal layer is nickel, and the second metal layer is gold. Then the desirable metallized powder has a four layer structure consisting of particle base-silicon polymer-nickel-gold. Gold is preferable as the second metal layer presenting the outermost surface of the conductive powder because gold has the highest conductivity among noble metals and does not undergo a rise of resistivity due to oxidation and sulfiding during long-term storage in a hot humid atmosphere. Nickel is preferable as the first metal layer because it is characterized by a low cost, corrosion resistance and appropriate hardness and serves as a stable underlying layer for bearing the second metal layer.

DETAILED DESCRIPTION OF THE INVENTION

Figure 1:
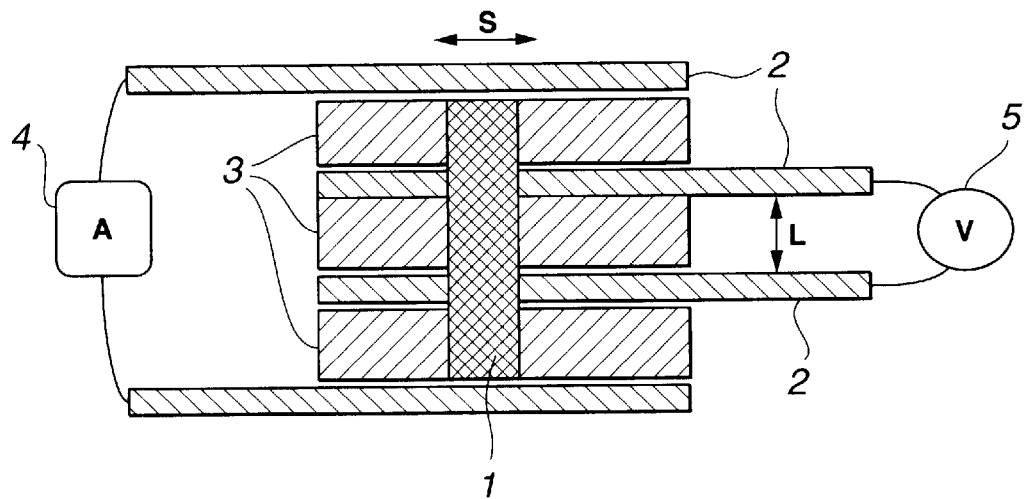
FIG. 1 illustrates an instrument for measuring the conductivity of a conductive powder.

The conductive powder of the invention is based on particles each having a surface on which an organic silicon polymer layer and a metal layer are successively formed.

The powder particles used herein include those of inorganic and organic materials which can accommodate electroless plating. The shape of particles may be spherical, rod, needle, hollow or irregular. All particulate materials which are handled as particles or powder on outer appearance are included. Such particles may have a size of about 0.001 μm to several mm, and desirably a mean particle size of 0.01 μm to 10,000 μm.

The inorganic powder particles used herein are typically inorganic fillers which are conventionally used as an extending filler, reinforcing filler or colorant in plastics and rubber. Include are metal powders, metal or non-metal oxides, metal silicates including aluminosilicates, metal carbides, metal nitrides, metal acid salts, metal halides, and carbon. Examples include silica, alumina, aluminum silicate, talc, mica, shirasu balloon, graphite, glass fibers, silicon fibers, carbon fibers, asbestos, potassium titanate whiskers, zinc white, aluminum nitride, magnesium oxide, boron nitride, nickel powder and aluminum powder. The organic powder particles used herein include particles of insulating resins such as phenolic resins, polyester resins, epoxy resins, polyamide resins, polyimide resins, acrylic ester resins, acrylonitrile resins, urethane resins, polyacetal resins, alkyd resins, melamine resins, silicone resins, fluoro-resins, polyethylene resins, polypropylene resins, polybutene resins, polystyrene resins, polyvinyl chloride resins, poly(diaryl phthalate) resins, polyxylene resins, polyvinyl alcohol, and polycarbonate, as well as particles of low conductive resins such as polyaniline resins, polyacetylene resins, polythiophene resins and polypyrrole resins.

For use in electronic materials which require high reliability, inorganic powder particles which do not contain ionic metals and are stable in heat resistance are desirable. Silica is most desirable since it is compatible with silicon polymers. Silica is available as particles of silicon dioxide and is readily obtained by burning chlorosilane or water glass, spraying and firing an emulsion of hydrolyzed alkoxysilane, oxidizing gasified metallic silicon, or fusing quartz powder. Silica may take the form of powder, fibers or flakes while its shape is not critical. However, silica particles of spherical shape providing a minimum specific surface area among different shapes with an identical particle diameter is preferred in order to minimize the amount of plating metal (e.g., nickel or gold) used and ensure high loading in resins or rubber. Spherical particles which do not have surface-open pores in the interior are especially preferred in order to reduce the specific surface area. Fused quartz powder is useful in this respect.

Silica preferably has a particle size of 0.01 to 1,000 μm, more preferably 0.1 to 100 μm, and further preferably 1 to 50 μm. A particle size of less than 0.01 μm provides an increased specific surface area, which may increase the amount of plating metal used, leading to an economic disadvantage. Particles with a size in excess of 1,000 μm may be difficult to mix with resins or rubber.

According to the invention, the powder particles are covered on their surface with an organic silicon polymer (or siliceous high molecular weight compound) in the first step. The silicon polymers used herein are preferably those having reducing effect, including polysilanes, polycarbosilanes, polysiloxanes, and polysilazanes having Si—Si bonds and/or Si—H bonds, especially polysilanes, as well as polysiloxanes having hydrogen atoms directly attached to silicon atoms.

One preferred silicon polymer having Si—Si bonds in the molecule is a polysilane, which is preferably represented by the following general formula (1):

$$(R^1_m R^2_n X_p Si)_q \tag{1}$$

wherein $R^1$ and $R^2$ each are hydrogen or a substituted or unsubstituted monovalent hydrocarbon group; X is a group as defined for $R^1$, alkoxy group, halogen atom, oxygen atom or nitrogen atom; m, n and p are numbers satisfying $0.1 \leq m \leq 2$, $0.1 \leq n \leq 1$, $0 \leq p \leq 0.5$, and $1 \leq m+n+p \leq 2.5$, and q is an integer of $4 \leq q \leq 100,000$.

In formula (1), $R^1$ and $R^2$ are independently hydrogen or substituted or unsubstituted monovalent hydrocarbon groups. $R^1$ and $R^2$ may be the same or different. The monovalent hydrocarbon groups are aliphatic, alicyclic or aromatic ones. Preferred aliphatic or alicyclic monovalent hydrocarbon groups are those of 1 to 12 carbon atoms, especially 1 to 6 carbon atoms, for example, alkyl groups such as methyl, ethyl, propyl, butyl, pentyl and hexyl and cycloalkyl groups such as cyclopentyl and cyclohexyl. Preferred aromatic monovalent hydrocarbon groups are those of 6 to 14 carbon atoms, especially 6 to 10 carbon atoms, for example, phenyl, tolyl, xylyl, naphthyl and benzyl. Substituted monovalent hydrocarbon groups are those of the foregoing unsubstituted monovalent hydrocarbon groups in which some or all of the hydrogen atoms are replaced by halogen atoms, alkoxy groups, amino groups, and aminoalkyl groups, for example, monofluoromethyl, trifluoromethyl, and m-dimethylaminophenyl.

X is a group as defined for $R^1$, alkoxy group, halogen atom, oxygen atom or nitrogen atom. Exemplary alkoxy groups are those of 1 to 4 carbon atoms such as methoxy, ethoxy, and isopropoxy. Exemplary halogen atoms are fluorine, chlorine and bromine atoms. Among others, X is preferably methoxy or ethoxy.

Letters m, n and p are numbers satisfying $0.1 \leq m \leq 2$, preferably $0.5 \leq m \leq 1$; $0 \leq n \leq 1$, preferably $0.5 \leq n \leq 1$; $0 \leq p \leq 0.5$, preferably $0 \leq p \leq 0.2$; and $1 \leq m+n+p \leq 2.5$, preferably $1.5 \leq m+n+p \leq 2$. Letter q is an integer of $4 \leq q \leq 100,000$, preferably $10 \leq q \leq 10,000$.

The preferred silicon polymer having hydrogen atoms directly attached to silicon atoms (Si—H groups) is a polysiloxane having Si—H groups on side chains and Si—O—Si bonds on the backbone. Such polysiloxane is represented by the following general formula (2):

$$(R^3_a R^4_b H_c SiO_d)_e \tag{2}$$

wherein $R^3$ and $R^4$ each are hydrogen, a substituted or unsubstituted monovalent hydrocarbon group, alkoxy group or halogen atom; a, b, c and d are numbers satisfying $0.1 \leq a \leq 2$, $0 \leq b \leq 1$, $0.01 \leq c \leq 1$, $0.5 \leq d \leq 1.95$, and $2 \leq a+b+c+d \leq 3.5$, and e is an integer of $2 \leq e \leq 100,000$.

In formula (2), $R^3$ and $R^4$ are independently hydrogen, substituted or unsubstituted monovalent hydrocarbon groups, alkoxy groups or halogen atoms. $R^3$ and $R^4$ may be the same or different. The monovalent hydrocarbon groups are aliphatic, alicyclic or aromatic ones. Preferred aliphatic or alicyclic monovalent hydrocarbon groups are those of 1 to 12 carbon atoms, especially 1 to 6 carbon atoms, for example, alkyl groups such as methyl, ethyl, propyl, butyl, pentyl and hexyl and cycloalkyl groups such as cyclopentyl and cyclohexyl. Preferred aromatic monovalent hydrocarbon groups are those of 6 to 14 carbon atoms, especially 6 to 10 carbon atoms, for example, phenyl, tolyl, xylyl, naphthyl and benzyl. Substituted aliphatic, alicyclic or aromatic monovalent hydrocarbon groups are those of the foregoing unsubstituted monovalent hydrocarbon groups in which some or all of the hydrogen atoms are replaced by halogen atoms, alkoxy groups, amino groups, and aminoalkyl groups, for example, monofluoromethyl, trifluoromethyl, and m-dimethylaminophenyl. Exemplary alkoxy groups are those of 1 to 4 carbon atoms such as methoxy, ethoxy, and isopropoxy. Exemplary halogen atoms are fluorine, chlorine and bromine atoms. Among others, methoxy or ethoxy is preferred.

Letters a, b, c and d are numbers satisfying $0.1 \leq a \leq 2$, preferably $0.5 \leq a \leq 1$; $0 \leq b \leq 1$, preferably $0.5 \leq b \leq 1$; $0.01 \leq c \leq 1$, preferably $0.1 \leq c \leq 1$; $0.5 \leq d \leq 1.95$, preferably $1 \leq d \leq 1.5$; and $2 \leq a+b+c+d \leq 3.5$, preferably $2 \leq a+b+c+d \leq 3.2$. Letter e is an integer of $2 \leq e \leq 100,000$, preferably $10 \leq e \leq 10,000$.

In the first step according to the invention, the above-described powder particles are treated with an organic silicon polymer to form an organic silicon polymer layer on the particle surface. To this end, the silicon polymer is dissolved in an organic solvent. The particles are poured into the solution or vice verse. After mixing, the organic solvent is removed whereby a silicon polymer layer is formed on the particle surface.

The organic solvents in which the silicon polymer is dissolved include aromatic hydrocarbon solvents such as benzene, toluene and xylene, aliphatic hydrocarbon solvents such as hexane, octane and cyclohexane, ether solvents such as tetrahydrofuran and dibutyl ether, esters such as ethyl acetate, aprotic polar solvents such as dimethylformamide, dimethyl sulfoxide and hexamethyl phosphoric triamide, nitromethane and acetonitrile.

The solution preferably has a concentration of 0.01 to 50% by weight, more preferably 0.01 to 30% by weight, most preferably 0.1 to 10% by weight of the silicon polymer. With a too low concentration, the resulting silicon polymer layer would become too thin and difficult to form evenly on the particle surface. A large amount of the solvent used may invite a cost increase. With a too high concentration, the resulting silicon polymer layer would become thick so that the coated particles might tend to agglomerate.

As the preferred treating technique, a slurry of the solution having the silicon polymer dissolved therein and the particles are brought into dispersing contact by rotating an agitation blade in a container. Thereafter, the solvent is removed by filtration or distilling off at elevated temperature or in vacuum. A spraying technique of dispersing the slurry in a gas stream for achieving instantaneous drying is also preferable. Drying is also achieved by agitating the slurry at a temperature above the boiling point of the solvent and a suitable pressure, which technique is effective for preventing agglomeration. In the above treating step, the organic solvent is distilled off at an elevated temperature or under vacuum. The most effective drying is by agitating the slurry at a temperature above the boiling point of the solvent, for example, at a temperature of about 40 to 200° C. under a vacuum of 1 to 100 mmHg.

At the end of treatment, the treated particles are held for a while in a dry atmosphere or at a temperature of 40 to 200° C. under vacuum. During the period, the solvent is effectively distilled off and the treated particles are dried. In this way, silicon polymer-coated particles are obtained.

The silicon polymer layer generally has a thickness of 0.001 to 1.0 $\mu$m, desirably 0.01 to 0.1 $\mu$m. With a thickness of less than 0.001 $\mu$m, it may difficult to form a silicon polymer layer uniformly on the particle surface, leaving some surface areas uncovered. A thickness of more than 1.0 $\mu$m, that is, a thick silicon polymer layer may cause the coated particles to agglomerate and increase the amount of silicon polymer used, which is economically disadvantageous.

In the second step according to the invention, the silicon polymer-treated powder particles resulting from the first step are treated with a metal salt. This is done by bringing the surface of the silicon polymer-treated powder particles in contact with a solution of the metal salt. In this treatment, owing to the reducing action of the silicon polymer, metal colloid deposits on the surface of the silicon polymer coat.

It is known in connection with electroless plating that a conductive powder is obtained by surface treating particles with a solution containing noble metal ions such as palladium to form a noble metal layer on the particle surface, and contacting the treated particles with a plating solution containing metal ions, whereby the metal deposits in coating form on the surface of the noble metal layer from the plating solution, thereby forming a uniform, firmly adhering metal coating on the particle surface. The noble metal layer has a catalytic function of promoting the deposition of metal ions on the particle surface from the plating solution in the subsequent step.

In order that noble metal ions be firmly captured on the particle surface and play the role of catalytic nuclei in the subsequent step, it is a common practice to surface treat the particle surface with a surface treating agent capable of capturing noble metal ions (see JP-A 59-182961.)

However, simply capturing noble metal ions is insufficient. Since noble metal ions are dissolvable in water, the noble metal can be dissolved out as ions into the plating solution in the subsequent step whereby its function as catalytic nuclei is aggravated. It is thus proposed in JP-A 1-242782 to add a reducing agent to the plating solution used in the subsequent step whereby the noble metal ion layer which has simply deposited on the particle surface is converted into a colloid which can function as uniform complete catalytic nuclei.

In contrast, the present invention utilizes the reducing action of the silicon polymer covering the particle surface so that a metal colloid deposits from the metal ion to form a robust metal layer which functions as catalytic nuclei.

The metal salt from which the metal colloid is formed is a salt of a metal having a standard oxidation-reduction potential of at least 0.54 volt. Specifically salts of gold having a standard oxidation-reduction potential of 1.50 volts, palladium having a standard oxidation-reduction potential of 0.99 volt, and silver having a standard oxidation-reduction potential of 0.80 volt are preferably used. Salts of metals having a standard oxidation-reduction potential of lower than 0.54 volt, for example, copper having a standard oxidation-reduction potential of 0.34 volt and nickel having a standard oxidation-reduction potential of 0.25 volt are difficult to be reduced by the silicon polymer.

The gold salts are those of $Au^+$ or $Au^{3+}$, for example, $NaAuCl_4$, $NaAu(CN)_2$, and $NaAu(CN)_4$. The palladium salts are those of $Pd^{2+}$ and are generally represented by Pd—-$Z_2$ wherein Z is a halogen such as Cl, Br or I, acetate, trifluoroacetate, acetylacetonate, carbonate, perchlorate, nitrate, sulfate, or oxide. Examples are $PdCl_2$, $PdBr_2$, $PdI_2$, $Pd(OCOCH_3)_2$, $Pd(OCOCF_3)_2$, $PdSO_4$, $Pd(NO_3)_2$, and PdO. The silver salts are those which generate $Ag^+$ when dissolved in a solvent and are generally represented by Ag—Z wherein Z is perchlorate, borate, phosphate or sulfonate. Examples are $AgBF_4$, $AgClO_4$, $AgPF_6$, $AgBPh_4$, $Ag(CF_3SO_3)$, and $AgNO_3$.

As the contact technique of treating the powder particles with a solution of the metal salt, it is preferred to prepare a solution of the metal salt in a solvent which does not dissolve the silicon polymer, but can dissolve or disperse the metal salt, and admit the silicon polymer-coated powder particles into the solution whereby the particles are contacted with the metal salt. With this treatment, the metal salt is adsorbed and simultaneously reduced on the surface of the silicon polymer layer covering powder particles, forming metal-coated powder particles.

Examples of the solvent which does not dissolve the silicon polymer, but can dissolve or disperse the metal salt include water, ketones such as acetone and methyl ethyl ketone, alcohols such as methanol and ethanol, and aprotic polar solvents such as dimethylformamide, dimethyl sulfoxide and hexamethyl phosphoric triamide, with water being especially preferred.

The concentration of the metal salt varies with the solvent in which the salt is dissolved and preferably ranges from 0.01% by weight to the salt saturated solution. A concentration of less than 0.01% may provide insufficient catalysis for plating. Beyond the saturated solution, the solid salt will undesirably precipitate out. When the solvent is water, the concentration of the metal salt is preferably 0.01 to 20%, and more preferably 0.1 to 5% by weight.

Typically, the silicon polymer-treated powder particles are immersed in a solution of the metal salt at room temperature to 70° C. for about 0.1 to 120 minutes, more preferably about 1 to 15 minutes. Then there is obtained a powder in which metal colloid has deposited on the surface of the silicon polymer layer.

According to the invention, the treatment with the metal salt solution is effected either in the presence or absence of a surfactant, desirably in the presence of a surfactant. More particularly, as a result of the silicon polymer treatment, the particles are hydrophobic. The silicon polymer-coated particles have less affinity to the metal salt solution and are not readily dispersed therein, indicating that the reaction of forming metal colloid is inefficient. It is thus recommended to add a surfactant to improve the dispersion, ensuring that the silicon polymer-coated particles are briefly dispersed in the metal salt solution.

The surfactant used herein may be any of anionic surfactants, cationic surfactants, ampholytic surfactants, and nonionic surfactants.

The anionic surfactants include sulfonic salts, sulfuric ester salts, carboxylic salts, and phosphoric ester salts. The cationic surfactants include ammonium salts, alkylamine salts and pyridinium salts. The ampholytic surfactants include betain, aminocarboxylic acid, and amine oxide surfactants. The nonionic surfactants include ether, ester and silicone surfactants.

Illustratively, the anionic surfactants include alkylbenzenesulfonic acid salts, sulfosuccinic acid esters, polyoxyethylene alkyl sulfate salts, alkyl phosphate esters, and long chain fatty acid soaps. The cationic surfactants include alkyl chloride trimethylammonium salts, dialkyl chloride dimethylammonium salts, and alkyl chloride pyridinium salts. The ampholytic surfactants include betain sulfonic salts and betain aminocarboxylic amine salts. The nonionic surfactants include polyoxyethylene alkyl ethers, polyoxyethylene fatty acid esters and polyoxyalkylene-modified polysiloxanes. A commercially available aqueous solution of such surfactant, for example, Mama Lemon® (Lion Corporation) is also useful.

The amount of the surfactant added is preferably such that the silicon polymer-coated particles may be uniformly dispersed in the metal salt solution containing a surfactant or a surfactant solution. Desirably 0.0001 to 10 parts, more desirably 0.001 to 1 part, and especially 0.01 to 0.5 part by weight of the surfactant is used per 100 parts by weight of the metal salt solution. Less amounts of the surfactant are less effective whereas excessive amounts of the surfactant may adversely affect the covering power of subsequent plating and cause discoloration of the plated metal.

As the treating technique involving the use of a surfactant, it is recommended that the silicon polymer-treated powder particles are first contacted with the surfactant alone or the surfactant diluted with water, dispersed by agitation, and then contacted with the metal salt solution. With this order, the reducing action of the silicon polymer promotes the reaction of forming the metal on the silicon polymer layer surface.

Where the surfactant is omitted, the silicon polymer-treated powder particles are contacted with the solvent and dispersed therein by thorough agitation.

After the above treatment, the treated particles are treated with a fresh solvent of the same type, but free of the metal salt for removing the unnecessary metal salt which has not been carried on the particles. Finally the unnecessary solvent is dried off from the particles, yielding a metal-coated powder. Drying is preferably effected at 0 to 150° C. under atmospheric pressure or vacuum.

According to the invention, the next step is to effect electroless plating on the metal-coated powder. By effecting electroless plating while the metal colloid resulting from the second step serves as a catalyst, powder particles covered completely with a variety of metals can be produced. The metal layer may be a single layer or plural layers, and preferably consists of a first metal layer (or underlying metal layer) and a second metal layer overlying the first metal layer.

The electroless plating solution used to form the first metal layer may be selected from a variety of well-known solutions. The preferred metals to be added to the plating solution are metal materials containing, for example, nickel, copper, silver, cobalt, tungsten, iron and zinc. These metals may be used alone or as alloys thereof, such as Ni—Co, Ni—W, Ni—Fe, Co—W, Co—Fe, Ni—Cu, and Ni—P. When it is desired to form an alloy coating, a plurality of metal salts may be added. Nickel is especially preferred.

In addition to the metal salt(s), the electroless plating solution generally contains a reducing agent such as sodium hypophosphite, hydrazine dimethylamine boron, or sodium boron hydride and a complexing agent such as sodium acetate, phenylenediamine or sodium potassium tartrate. Electroless plating solutions containing copper, nickel, silver and gold are commercially available at a reasonable cost.

The electroless nickel plating solution is described in detail. Generally, the electroless nickel plating solution contains a water-soluble nickel salt, complexing agent, pH adjuster, and reducing agent.

The nickel salt used herein may be selected from well-known salts such as nickel sulfate, nickel chloride and nickel acetate. The nickel salt concentration may be 0.5 to 0.01 mol/l, and preferably 0.2 to 0.05 mol/l of the entire plating bath. A too high nickel salt concentration has the drawbacks that a slight change of pH or a slight change of complexing agent concentration may cause formation of hydroxide to reduce the life of the bath and that replenishment tends to invite a local variation of the nickel salt concentration which in turn, causes formation of spots. A too low nickel salt concentration may require a greater amount of replenishment solution so that the volume of the bath largely changes during plating, which is impractical.

The complexing agent may be selected from well-known complexing agents used in electroless nickel plating solutions of this type. Included are ammonium salts of inorganic acids such as ammonium chloride, phosphoric salts, carboxylic acids and water-soluble salts thereof such as sodium acetate, hydroxycarboxylic acids and water-soluble salts thereof such as ammonium citrate and sodium tartrate, and amines having amino and carboxyl groups and water-soluble salts thereof such as glycine and EDTA. They may be used alone or in admixture of two or more. The complexing agent is not limited to these examples. Of these complexing agents, the hydroxycarboxylic acid salts such as ammonium citrate and sodium tartrate, carboxylic acid salts such as sodium acetate, and amines having amino and carboxyl groups such as glycine are preferable because they do not allow nickel hydroxide to form even when the pH of the plating bath changes and because they do not form with nickel a complex ion which is stable enough to prevent reductive deposition of nickel. The concentration of the complexing agent is closely correlated to the concentrations of the nickel salt and pH adjuster and usually in the range of 1.5 to 0.03 mol/l and preferably 0.2 to 0.15 mol/l of the entire plating bath. A larger amount of the complexing agent which is excessive relative to the nickel salt is wasteful. A smaller amount of the complexing agent may invite instability to a pH change and be less effective for restraining formation of nickel hydroxide.

As the pH adjuster, any of well-known, inexpensive, readily available agents may be used. Ammonium hydroxide (aqueous ammonia) and alkali hydroxides such as sodium hydroxide are preferably used because they do not largely alter the reduction of nickel complex ion by the phosphorus reducing agent relative to a pH change. The concentration of the pH adjuster may be determined in accordance with a change of pH of the plating bath during the process, treating time, and replenishment amount.

The pH of the electroless nickel plating solution is selected depending on the type of the reducing agent and complexing agent. In the case of hypophosphorous acid or salt as the reducing agent, the solution is generally set at pH 3 to 10. Below pH 3, little plating reaction occurs. Beyond pH 10 may render the nickel complex unstable, and allow for precipitation of nickel hydroxide and degradation of the plating solution. Since the pH lowers with the progress of electroless nickel plating, the pH adjuster is preferably replenished so as to keep a constant pH. It is also recommended to adjust the bath such that the bath may be at pH 3 to 4, especially pH 4 to 5 at the start of plating and at pH 6 to 10, especially pH 6 to 7 at the end of plating.

The reducing agent used herein is preferably a phosphorus reducing agent which is selected from hypophosphorous acid and alkali metal and ammonium salts thereof, typically sodium hypophosphite. A boron reducing agent such as dimethylamine boron is also preferably used. The concentration is desirably 0.1 to 5 mol, more desirably 0.5 to 3 mol of the reducing agent per mol of the nickel salt and 2.5 to 0.001 mol/l, more desirably 1.0 to 0.1 mol/l of the entire plating bath.

According to the invention, treatment with the electroless plating solution can be effected in the presence of a surfactant if necessary. In this embodiment, the metal-coated powder particles are pretreated with the surfactant prior to pouring into the electroless plating solution, or the surfactant is poured into the electroless plating solution prior to plating treatment. This avoids the undesirable phenomenon that bubbles of hydrogen gas evolving during electroless plating reaction prevent the effective progress of electroless plating and exacerbate the covering power of the metal to the particle surface. Then the powder particles coated with the silicon polymer can be uniformly surface coated with the metal film.

The surfactant used in electroless plating may be the same as or different from the surfactant used in the previous metal salt treatment (treatment with the metal salt solution). It is preferable to use a different surfactant. For example, better results are expected when an anionic surfactant such as sodium alkylbenzenesulfonate is used for improving the contact with the metal salt solution and a nonionic surfactant such as polyoxyethylene fatty acid ester or polyoxyalkylene-modified polysiloxane is added prior to the electroless plating. More illustratively, those surfactants which act to reduce surface tension, but do not help foaming are desirable. Nonionic surfactants such as Surfynol 104, 420 and 504 (Nisshin Chemical Industry K.K.) are preferably used. A lowering of plating efficiency by foaming can be avoided by adding an anti-foaming surfactant having an anti-foaming effect and reducing surface tension, for example, a polyether-modified silicone surfactant commercially available as KS-538 from Shin-Etsu Chemical Industry Co., Ltd.

The amount of the surfactant added is similarly selected such that the metal-coated powder particles may be uniformly dispersed in the electroless plating solution and the sticking of bubbles of hydrogen gas evolving with the progress of electroless plating to the powder particles to restrain the electroless plating may be avoided. Desirably, the surfactant is used in an amount of 0.0001 to 10 parts, more desirably 0.001 to 1 part, most desirably 0.01 to 0.5 part by weight per 100 parts by weight of the electroless plating solution. A less amount of the surfactant may be less effective whereas an excessive amount may adversely affect the covering power of plating metal and cause discoloration of the plated metal.

The plating temperature may be in the range of 15 to 100° C., desirably in the range of 40 to 95° C. which allows metal ions to diffuse at a higher rate in the bath, improves the covering power of plating metal, and reduces the loss of bath components and the loss of solvent by volatilization, and more desirably in the range of 65 to 85° C. At temperatures below 40° C., plating reaction may proceed very slowly, which is impractical. At temperatures above 95° C., bath control may become difficult because of vigorous evaporation of the solvent which is water, and plating reaction may proceed too fast, causing abnormal deposition and bath decomposition.

As the plating technique, the powder particles resulting from the second step or the water dispersion of the powder particles may be added to the electroless plating solution, or inversely, the electroless plating solution may be added to the water-dispersed powder particles. The key is to ensure that metal depositing reaction proceeds substantially simultaneously on powder particles. When the particles or water dispersion thereof are added to the electroless plating solution, it is recommended that the solution is kept at a so low temperature that no plating reaction occurs, the entire particles are dispersed in the solution in a non-agglomerated state, and plating is thereafter commenced as by heating. Also, when the electroless plating solution is added the powder particles, it is recommended that the particles are previously dispersed in water or the like in a non-agglomerated state, and the plating solution is brought into close contact with the particles as by agitation whereby plating takes place. In the case, the electroless plating solution may be a solution obtained by premixing a plating metal salt solution, reducing agent solution, pH adjuster solution and complexing agent solution. Alternatively, the respective components are separately added to form the electroless plating solution in situ. Besides the procedure, all the powder particles are dispersed in a solution containing a reducing agent, pH adjuster and complexing agent, and only the metal salt solution carried by a gas stream is added to the dispersion whereupon electroless plating takes place.

For producing nickel-coated powder particles without agglomeration, it is very effective to disperse the powder particles in a solution containing a reducing agent, pH adjuster and complexing agent, keep this dispersion at an appropriate temperature for nickel plating, carry an aqueous nickel salt solution on a gas stream, and add the gas-borne nickel salt solution to the dispersion of powder particles. With the help of the carrier gas, the aqueous nickel salt solution is quickly and uniformly dispersed in the aqueous solution containing the reducing agent, pH adjuster and complexing agent whereby the powder particles are surface plated with nickel. Although the introduction of gas often invites a loss of plating efficiency due to foaming, this inconvenience can be avoided by adding an anti-foaming surfactant. Useful to this end is a surfactant having an anti-foaming effect and reducing surface tension, for example, a polyether-modified silicone surfactant commercially available as KS-538 from Shin-Etsu Chemical Co., Ltd.

In the case of electroless nickel plating, the oxygen concentration of the plating solution affects the deposition of nickel. The deposition of nickel is restrained by the presence of more dissolved oxygen because colloidal palladium serving as plating catalyst nuclei can be oxidized into palladium cations and dissolved out in the solution, and the once deposited nickel surface can be oxidized. Inversely, in the presence of less dissolved oxygen, the plating solution loses stability and nickel can deposit on areas other than the powder particles, resulting in formation of fine nickel powder masses and bulbous deposits. It is thus desirable to maintain the dissolved oxygen in the plating solution at a concentration of 1 to 20 ppm. Above 20 ppm, the plating rate may drop and uncovered spots be left. Below 1 ppm, formation of bulbous deposits is sometimes observed.

Therefore, it is preferable to use as the gas a mixture of an oxygen-containing gas such as air and an inert gas such as argon or nitrogen. In the case of plating on powder particles, the start of plating is often delayed, but there is the risk that once plating is started, the reaction runs away. In one effective procedure for preventing the risk, nitrogen is initially used and after the start of nickel plating reaction is confirmed, the gas is changed to air.

Where electroless nickel plating is effected using a phosphorus reducing agent, the properties of a nickel film can be controlled by controlling the plating procedure because phosphorus is incorporated into nickel. For example, the powder particles are added to an aqueous solution containing a nickel salt, reducing agent, pH adjuster and complexing agent and held at a temperature of 25° C. at which substantial nickel plating does not take place, the system is fully dispersed, and then heated to an optimum temperature of 40 to 95° C. for nickel plating. This procedure enables to effect nickel plating without substantially changing the proportion of the reducing agent concentration relative to the nickel salt concentration in the plating solution and the pH of the plating solution. Then a nickel layer having a phosphorus content which is substantially equal between inner and outer surface regions is deposited on the powder particles.

It is also possible to effect nickel plating by dispersing the powder particles of the second step in an aqueous solution of a phosphorus reducing agent and adding thereto an aqueous solution containing a nickel salt, and complexing agent and a pH adjuster solution, and changing the proportion of the reducing agent concentration relative to the nickel salt concentration in the plating solution and the pH of the plating solution. Then a nickel layer having a phosphorus content which is different between inner and outer surface regions is deposited on the powder particles. In this embodiment, there may be furnished first and second plating solutions having different contents of the phosphorus reducing agent, and plating in the first plating solution be followed by plating in the second plating solution. Alternatively, after plating is effected in the first plating solution, an aqueous solution containing one or more of a nickel salt, complexing agent and pH adjuster, but not the phosphorus reducing agent is replenished to form the second plating solution in situ where second plating is effected. The nickel salt, completing agent and pH adjuster used for this replenishment are preferably the same as used in the first plating solution. The replenishment is not limited to one and may be repeated two or three times.

In the embodiment wherein electroless nickel plating in a first electroless nickel plating solution is followed by electroless nickel plating in a second electroless nickel plating solution having a different phosphorus reducing agent concentration from the first solution whereby a nickel-phosphorus alloy layer having a phosphorus content which is different between inner and outer surface regions is deposited on the powder particles, it is preferred that the phosphorus reducing agent concentration of the first electroless nickel plating solution is higher than the phosphorus reducing agent concentration of the second electroless nickel plating solution so that the inner surface region of the nickel-phosphorus alloy layer has a high phosphorus content and the outer surface region has a low phosphorus content. More particularly, the first plating solution has a phosphorus reducing agent concentration of 2.5 to 0.05 mol/l, especially 1.5 to 0.1 mol/l of the entire plating solution whereby the inner surface region has a phosphorus content of 5 to 20%, especially 8 to 15%. The second plating solution has a phosphorus reducing agent concentration of 1.0 to 0 mol/l, especially 0.5 to 0 mol/l of the entire plating solution whereby the outer surface region has a phosphorus content of 0.5 to 8%, especially 1 to 5%. The nickel-phosphorus alloy layer preferably has a thickness of 0.01 to 10 $\mu$m, especially 0.05 to 2 $\mu$m though the thickness is not critical. Of this thickness, a region extending from the outer surface to at least 0.1 $\mu$m, especially to 0.5 $\mu$m is preferably the second nickel-phosphorus alloy layer.

In the third step, the plating time varies with the desired thickness of the plating film and is not particularly limited. Usually the plating time is 1 minute to 16 hours, preferably 5 to 120 minutes, and more preferably 10 to 60 minutes.

In this way, the first metal layer is formed on the powder particles. According to the invention, a second metal layer is advantageously formed so as to enclose the first metal layer. In this embodiment, the third step of forming the first metal layer is followed by the fourth step of forming the second metal layer as quickly as possible because the second metal layer should be formed before the first metal layer is oxidized.

The fourth step is to effect further plating on the powder particles resulting from the third step to form a second metal layer on the first metal layer, yielding a conductive powder. The method for forming the second metal layer or surface film on the powder particles having the first metal layer already formed thereon may be electroless plating, electroplating or displacement plating. In the case of electroplating, it is necessary to use a cathode configured to a special shape so that the metal may uniformly deposit on the powder particles and a system designed such that the powder particles may be periodically separated from the cathode. This step may also employ displacement plating that utilizes substitution reaction between the first and second metal layers at their interface due to a difference in ionization tendency therebetween.

Of these methods, the electroless plating method is advantageously employed in the fourth step.

The electroless plating solution used to form the second metal layer may be a solution prepared by the same method as above. The preferred metals to be added to the plating solution are gold, platinum and palladium. These metals may be used alone or as alloys thereof, such as Au—Pd, Au—Pt, and Pd—Pt. Of these, gold is especially preferred for stability and conductivity. Such a gold plating solution is on the market and readily available. The plating solutions generally include cyanide, chloride and sulfite solutions although the commercially easily available cyanide solutions are preferred mainly for the economic reason. The electroless plating method may be the same as in the third step.

The plating temperature may be in the range of 15 to 100° C., desirably in the range of 40 to 95° C. which allows metal ions to diffuse at a higher rate in the bath, improves the covering power of plating metal, and reduces the loss of bath components and the loss of solvent by volatilization, and more desirably in the range of 65 to 85° C. At temperatures below 40° C., plating reaction may proceed very slowly, which is impractical. At temperatures above 95° C., bath control may become difficult because of vigorous evaporation of the solvent which is water, and plating reaction may proceed too fast, causing abnormal deposition and bath decomposition. An appropriate plating time is 1 minute to 16 hours, preferably 5 to 120 minutes, and more preferably 10 to 60 minutes.

At the end of the fourth step, thorough washing is carried out to remove the unnecessary metal salt, reducing agent, complexing agent, surfactant and other additives.

In each of the second to fourth steps, it sometimes happens that some spots of the surface of each particle are left uncovered due to the agglomeration of particles. The agglomeration means that many powder particles gather together due to the secondary force. Since individual particles remain independent and not associated with each other, they separate by a slight force. If the silicon polymer-treated powder particles are in an agglomerated state in the second step, the metal colloid cannot deposit within agglomerates. If an agglomerated state exists in the third and fourth steps, the plating metal cannot deposit within agglomerates. In either case, there result powder particles which are partially uncovered with metal, failing to develop excellent conductivity.

To prevent such inconvenience, it is desirable in each step that the powder particles be dispersed in a solution without agglomeration. The dispersing method may use an agitator having an agitating blade driven by a motor or a homogenizer having a rotor for effecting agitation with the aid of sonic energy.

The thus obtained conductive powder consists of metal-coated powder particles having the four-layer structure of base particle-silicon polymer-first metal layer-second metal layer.

The first metal layer has a thickness of 0.01 to 10.0 $\mu$m, and preferably 0.1 to 2.0 $\mu$m. A thickness of less than 0.01 $\mu$m may fail to completely cover the particle surface or to provide satisfactory hardness and corrosion resistance. A thickness of more than 10.0 $\mu$m may be economically disadvantageous because a corresponding larger amount of the first metal increases the cost and specific gravity. The second metal layer has a thickness of 0.001 to 1.0 $\mu$m, and preferably 0.01 to 0.1 $\mu$m. A thickness of less than 0.001 $\mu$m may allow oxidation in a hot humid atmosphere, which results in an increased resistivity and hence, unstable conductivity. A thickness of more than 1.0 $\mu$m may be economically disadvantageous because a corresponding larger amount of the expensive second metal increases the cost and specific gravity.

If desired, the metal-coated powder particles are finally heat treated at a temperature of at least 150° C. in an atmosphere of an inert gas (e.g., argon, helium or nitrogen) or a reducing gas (e.g., hydrogen, argon-hydrogen or ammonia). The inert or reducing gas heat-treating conditions include a temperature of 150° C. to 900° C. and a time of 1 minute to 24 hours and desirably a temperature of 200° C. to 500° C. and a time of 30 minutes to 4 hours. This heat treatment converts part or all of the silicon polymer between the particle base and the metal layers into a ceramic so that the particles has higher heat resistance, insulation and adhesion. When the atmosphere is a reducing atmosphere such as hydrogen, the oxide in the metal layers can be decreased and the silicon polymer be converted into a stable structure whereby the powder particles possessing a stronger bond between particle base (typically silica) and metal and exhibiting higher conductivity are obtained. It is noted that if polysilane is treated at such a high temperature, Si—Si bonds are severed, allowing various elements to be incorporated therein for stabilization. As a result, heat treatment in an oxidizing atmosphere such as air produces silicon oxide ceramics, heat treatment in a reducing atmosphere such as ammonia gas produces silicon nitride ceramics, and heat treatment in an inert atmosphere such as argon or vacuum produces silicon carbide ceramics.

The conductive powder of the invention finds a wide range of application as a conductive filler. For example, the conductive powder is blended in rubber compositions such as silicone rubber compositions or resin compositions to impart high conductivity thereto.

EXAMPLE

Examples of the invention are given below by way of illustration and not by way of limitation.

Synthetic Example 1
Preparation of Polysilane

Phenylhydrogenpolysilane (abbreviated as PPHS) was prepared by the following procedure. In an argon-purged flask, a diethyl ether solution of methyl lithium was added to a THF solution of bis(cyclopentadienyl)dichlorozirconium. After 30 minutes of reaction at room temperature, the solvent was distilled off in vacuum whereby a catalyst was formed within the system. Phenyltrihydrosilane was added to this in an amount of 10,000 mol per mol of the catalyst. The contents were heated and agitated for 3 hours at 100 to 150° C. and then for 8 hours at 200° C. The product was dissolved in toluene and washed with aqueous hydrochloric acid whereby the catalyst was deactivated and removed. Magnesium sulfate was added to this toluene solution to remove water. By filtration, PPHS having a weight average molecular weight of 1,200 and a glass transition temperature of 65° C. was collected in a substantially quantitative yield.

EXAMPLE 1
Treatment of Silica with Silicon Polymer (1st Step)

The silica used herein was prepared by classifying spherical silica (Mitsubishi Rayon K.K., mean particle size 10 $\mu$m, specific surface area 0.4 m$^2$/g), cutting off a fraction of particles having a mean particle size of less than 1 μm, and collecting silica particles with a mean particle size of 12 μm and a specific surface area of 0.28 m²/g. This is designated SiO-12.

A solution of 0.5 g of PPHS in 65 g of toluene was added to 100 g of SiO-12, which was agitated for one hour into a slurry. Toluene and silica were separated by filtration. To remove toluene more completely, the silica was dried in a rotary evaporator at a temperature of 80° C. and a vacuum of 45 mmHg while rotating. The PPHS-treated spherical silica was disintegrated by means of a roll mill or jet mill. This is designated PPHS-treated SiO.

Preparation of Palladium Colloid-deposited Silica (2nd Step)

The polysilane-treated silica (PPHS-treated SiO) would float on the surface of water since it was hydrophobicized. 5 g of the treated silica was admitted into 10 g of a 0.5% aqueous solution of surfactant Surfynol 504 (Nisshin Chemical Industry K.K.) whereby the silica was dispersed in water. This is designated water dispersed PPHS-treated SiO.

For palladium treatment, 7 g of a 1% $PdCl_2$ aqueous solution (0.07 g of palladium chloride, 0.04 g of palladium) was added to 15 g of the water dispersed PPHS-treated SiO, followed by 30 minutes of agitation. By this treatment, palladium colloid adhered to the silica surface. The resulting silica was colored blackish gray.

The silica was separated from the aqueous palladium solution by filtration, washed with water, and immediately poured into 10 g of an aqueous solution containing a surfactant (0.1% aqueous solution of anti-foaming agent KS-538 by Shin-Etsu Chemical Co., Ltd.) for dispersing in water. This is designated water-dispersed PPHS-treated SiO—Pd.

Preparation of Nickel-plated Silica (3rd Step)

A plating solution was prepared by diluting 20 ml of an aqueous solution of 0.2 mol/l nickel sulfate, 20 ml of an aqueous solution of 0.4 mol/l sodium hypophosphite and 20 ml of an aqueous solution of 0.4 mol/l of sodium hydroxide, 5 ml of an aqueous solution of 0.05 mol/l sodium citrate, and 10 ml of an aqueous solution of 0.1 mol/l sodium acetate with ion-exchanged water to 100 ml. With stirring, 15 g of the water-dispersed PPHS-treated SiO—Pd was dispersed in 100 ml of the plating solution at 25° C. to form a plating solution. The solution temperature was quickly raised to 70° C. by immersing the container in a water bath at 70° C. After a while, fine bubbles started to evolve and the solution turned its color from deep green to blackish green.

Silica particles having metallic nickel deposited on the entire surface were obtained. The plated silica was separated from the plating solution by filtration, washed with pure water, and isolated by filtration again. While the silica remained wet, it was poured into 10 g of an aqueous solution containing a surfactant (0.1% aqueous solution of anti-foaming agent KS-538 by Shin-Etsu Chemical Co., Ltd.) whereby the silica was dispersed in water. This is designated water-dispersed nickel-coated silica.

Preparation of Gold-plated Silica (4th Step)

The gold plating solution used was 120 ml of a gold plating solution K-24N containing cyanoaurate (Kojundo Chemical Laboratory Co., Ltd.). With vigorous stirring, the entire amount of the water-dispersed nickel-coated silica was added to the gold plating solution. The solution temperature was raised from room temperature to 85° C., and immediately thereafter, the silica turned golden, indicating that the nickel on the silica surface was replaced by gold.

The plated silica was subjected to filtration, water washing and drying (at 50° C. for 30 minutes) and thereafter, fired at 250° C. for one hour in a hydrogen-purged electric furnace.

Properties of Conductive Silica Having Silica-silicon Polymer-nickel-gold Structure By observation under a stereomicroscope, it was found that the silica particles were covered with gold over their entire surface. The plated silica surface was observed under an electron microscope to find that a smooth and uniform metal film was formed. Upon IPC analysis, the gold-plated silica was found to contain 30 wt % of nickel and 6 wt % of gold.

The electric resistivity of the gold-plated silica was determined by introducing the gold-plated silica into a cylindrical cell having four terminals, conducting a current of --10 mA to 10 mA across the terminals of 0.2 cm² area at the opposed ends from a current source SMU-257 (Keithley Co.), and measuring a voltage drop across the 0.2 cm spaced apart terminals at the center of the cylinder by means of a nanovolt meter model 2000 (Keithley Co.).

The measuring instrument is shown in FIG. 1. There are illustrated gold-plated silica 1, gold-plated copper members 2, insulators 3 of silicone rubber, a current source 4, and a volt meter 5. Provided that ρ is a resistivity, S is the area of the electrode, L is the distance between electrodes, R is an electric resistance, I is the current conducted across the sample, and V is the measured voltage, the resistivity represented by ρ=RS/L is determined from the electric resistance R=V/I. If the instrument is designed such that S is X cm² and L is Y cm wherein X=Y. then the resistivity ρ is equal to R Ω-cm.

In this way, the electric resistivity of the gold-plated silica was determined to be 3.8 mΩ-cm.

After a thermal aging test (250° C., 1 hour in air), the gold-plated silica had an acceptable electric resistivity of 4.7 mΩ-cm.

The gold-plated silica was admitted into a powder peeling tester. An adhesion test was carried out by operating the tester at 1,100 rpm for one minute. The silica was examined to find no change of its outer appearance and resistivity. Additional adhesion tests were carried out by operating the tester at 1,100 rpm for 5 and 10 minutes. The silica was examined to find that its outer appearance turned somewhat black and the resistivity changed to 5.1 mΩ-cm and 8.9 mΩ-cm, respectively. When observed under a microscope, the interface between gold and nickel was partially peeled so that the black nickel was exposed, but no peel was found at the interface between silica and nickel.

Figure 2:
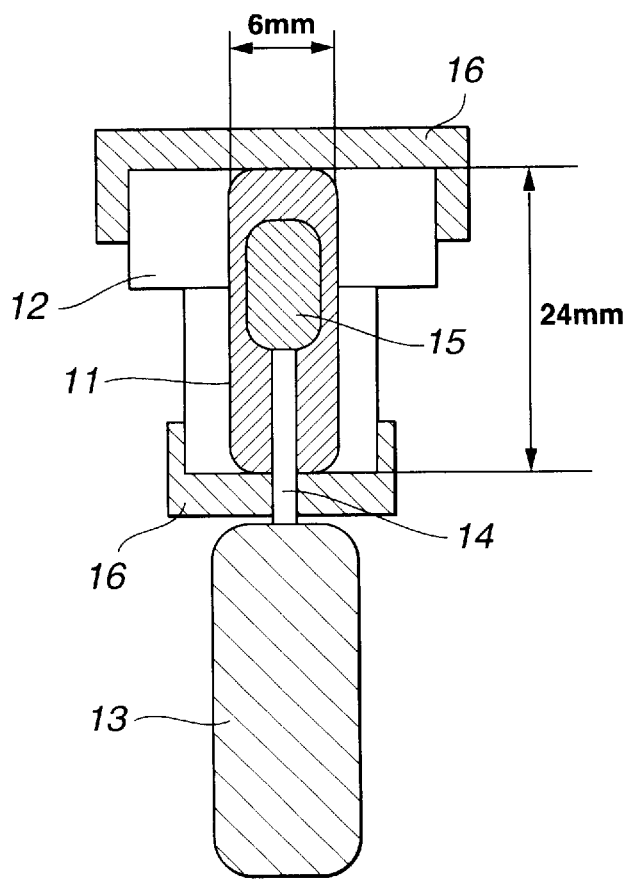
FIG. 2 illustrates a grinder type instrument for an adhesive force.

The powder peeling tester used herein is a grinder type peeling force measuring instrument as shown in FIG. 2. The instrument includes a container 12 which is filled with gold-plated silica 11 and closed with a rubber packing 16. A motor 13 has a rotating shaft 14 having an abrasive-bearing bit 15 attached to the tip thereof. The bit 15 is inserted into the silica 11 and rotated at a predetermined speed. The hollow cavity of the container 12 which is filled with the gold-plated silica has a volume of 0.68 cm³. The abrasive-bearing bit 15 has a diameter of 3 mm. The silica fill is 1.0 g.

Comparative Example 1

For comparison purposes, Example 1 was repeated except that the polysilane PPHS was omitted. Plating did not take place at all. No metallized silica was obtained.

Comparative Example 2

For comparison purposes, Example 1 was repeated except that the polysilane PPHS was omitted and instead, treatment was effected with 100 g of a 1% ethanol solution of γ-aminopropyltriethoxysilane (KBE-903 by Shin-Etsu Chemical Co., Ltd.). Plating partially took place, but entirely metallized silica was not obtained.

Comparative Example 3

For comparison purposes, Example 1 was repeated except that the polysilane PPHS was omitted and instead, treatment was effected with 100 g of a 1% ethanol solution of γ-aminopropyltriethoxysilane (KBE-903 by Shin-Etsu Chemical Co., Ltd.), and palladium colloid reduced with stannous chloride as disclosed in JP-A 59-182961 was used instead of the palladium chloride. Effective plating took place. Metallized silica was obtained, but some particles agglomerated.

This metallized silica had a low resistivity of 19.5 mΩ-cm. The silica was admitted into the powder peeling tester, which was operated at 1,100 rpm for one minute. The silica was examined to find that its outer appearance turned whiter and the resistivity became worse in excess of 1 Ω-cm. A microscopic observation showed that the silica-nickel interface was partially peeled to expose the underlying silica.

EXAMPLE 2

In the third step of Example 1, a plating solution was prepared by diluting 20 ml of an aqueous solution of 0.4 mol/l sodium hypophosphite and 20 ml of an aqueous solution of 0.4 mol/l of sodium hydroxide, 5 ml of an aqueous solution of 0.05 mol/l sodium citrate, and 10 ml of an aqueous solution of 0.1 mol/l sodium acetate with ion-exchanged water to 100 ml. With stirring, 15 g of the water-dispersed PPHS-treated SiO—Pd was dispersed in 100 ml of the plating solution to form a plating solution. The solution temperature was quickly raised to 70° C. by immersing the container in a water bath at 70° C.

To this was added 1 ml of an aqueous solution of 0.2 mol/l nickel sulfate. After a while, fine bubbles started to evolve and the pale green solution turned clear. Sequentially, 19 ml of an aqueous solution of 0.2 mol/l nickel sulfate was slowly added dropwise to the plating solution which was being agitated, whereby plating reaction took place. Otherwise, the procedure was the same as in Example 1. Silica particles covered with gold over their entire surface were obtained as in Example 1.

Identification of Conductive Silica having Silica-silicon Polymer-nickel-gold Structure The gold-plated silica was fixedly buried in a resin piece, which was sliced by a diamond cutter. The cross section was observed under a transmission electron microscope H9000NAR (Hitachi, Ltd.), finding a two-layer structure consisting of a silica portion and a multi-phase metal portion. The constituent elements were analyzed in a depth direction to find a multi-layer structure consisting of a gold layer, a nickel layer, and a silicon layer stacked in the depth direction. With respect to the phosphorus content of the nickel layer, a region of the nickel layer disposed adjacent the silica had a high phosphorus content (of about 8 to 12 wt %), and a region of the nickel layer disposed adjacent the gold had a low phosphorus content (of about 1 to 4 wt %), indicating that the nickel layer had a graded composition structure.

The gold-plated silica had a resistivity of 3.1 mΩ-cm. After a thermal aging test (250° C., 1 hour in air), the gold-plated silica had an acceptable electric resistivity of 4.1 mΩ-cm.

The gold-plated silica was admitted into a powder peeling tester, which was operated at 1,100 rpm for one minute. The silica was examined to find no change of its outer appearance and resistivity. Additional adhesion tests were carried out by operating the tester at 1,100 rpm for 5 and 10 minutes. The silica was examined to find that the resistivity changed to 4.1 mΩ-cm and 5.9 mΩ-cm, respectively, indicating high peel resistance.

EXAMPLE 3

In the third step of Example 1, the water-dispersed PPHS-treated SiO—Pd was first dispersed in 100 ml of pure water by agitation. The solution temperature was quickly raised to 70° C. by immersing the container in a water bath at 70° C. Then 20 ml of an aqueous solution of 0.2 mol/l nickel sulfate, 20 ml of an aqueous solution of 0.4 mol/l sodium hypophosphite and 20 ml of an aqueous solution of 0.4 mol/l of sodium hydroxide, 5 ml of an aqueous solution of 0.05 mol/l sodium citrate, and 10 ml of an aqueous solution of 0.1 mol/l sodium acetate were simultaneously added dropwise to the solution whereby plating reaction took place. Otherwise, the procedure was the same as in Example 1. Silica particles covered with gold over their entire surface were obtained.

A cross section of the gold-plated silica was observed as in Example 2, finding a multi-layer structure consisting of a gold layer, a nickel layer, and a silicon layer. The constituent elements were analyzed in a depth direction to find that the nickel layer had an approximately equal phosphorus content of about 12 to 19 wt % in a depth direction, indicating that no graded structure was formed.

The gold-plated silica had an initial resistivity of 3.5 mΩ-cm. After a thermal aging test (250° C., 1 hour in air), the gold-plated silica had an acceptable electric resistivity of 4.5 mΩ-cm.

The gold-plated silica was admitted into a powder peeling tester, which was operated at 1,100 rpm for one minute. The silica was examined to find no change of its outer appearance and resistivity. Additional adhesion tests were carried out by operating the tester at 1,100 rpm for 5 and 10 minutes. The silica was examined to find that the resistivity changed to 7.5 mΩ-cm and 8.9 mΩ-cm, respectively.

Synthetic Example 2
Preparation of Phenylpolysilane

In an argon-purged flask, a diethyl ether solution of methyl lithium was added to bis(cyclopentadienyl) dichlorozirconium, thereby preparing bis(cyclopentadienyl) dimethylzirconium serving as a catalyst in the system. Phenylsilane was added to the system in an amount of 50 mol per mol of the catalyst, which was heated and agitated at 150° C. for 24 hours. The catalyst was then removed by adding a molecular sieve and effecting filtration, and solid PPHS having a weight average molecular weight of 2,600 was collected in a substantially quantitative yield.

EXAMPLE 4
Treatment of Silica with Silicon Polymer

The silica used herein was spherical silica US-10 (Mitsubishi Rayon K.K., mean particle size 10 μm, specific surface area 0.4 m$^2$/g). A solution of 1 g of PPHS in 65 g of toluene was added to 100 g of US-10, which was agitated for one hour into a slurry. Toluene and silica were separated by filtration. To remove toluene more completely, the silica was dried in a rotary evaporator at a temperature of 80° C. and a vacuum of 45 mmHg while rotating. The PPHS-treated spherical silica was disintegrated by means of a roll mill or jet mill.

Preparation of Palladium Colloid-deposited Silica

The PPHS-treated silica would float on the surface of water since it was hydrophobicized. 100 g of the PPHS-treated spherical silica was admitted into 50 g of a 0.5% aqueous solution of surfactant Surfynol 504 (Nisshin Chemical Co., Ltd.) whereupon the silica was dispersed in water by agitation.

For palladium treatment, 70 g of a 1% $PdCl_2$ aqueous solution (0.7 g of palladium chloride, 0.4 g of palladium) was added to 150 g of the silica-water dispersion, followed by 30 minutes of agitation, filtration and water washing. By this treatment, palladium colloid adhered to the silica surface, and so the silica was colored blackish gray. The palladium colloid-deposited silica was isolated by filtration, washed with water, and immediately subjected to plating.

Nickel Plating of Palladium Colloid-deposited Silica

With stirring, 10 g of the palladium colloid-deposited silica was dispersed along with 0.5 g of anti-foaming agent KS-538 (Shin-Etsu Chemical Co., Ltd.) in 500 ml of a plating solution at 50° C. which had been diluted with ion-exchanged water so as to contain 0.3 mol/l of nickel sulfate, 0.36 mol/l of ammonium citrate and 0.36 mol/l of ammonium hypophosphite. The solution temperature was quickly raised to 85° C. by immersing the container in a water bath at 85° C. After a while, fine bubbles started to evolve and the solution turned its color from deep green to blackish green and begun to lower its pH from 4. Then 500 ml of a mixed solution of 0.3 mol/l nickel sulfate and 0.72 mol/l ammonium citrate and 20 ml of an aqueous solution of about 8 vol % ammonia were slowly replenished to the plating solution which was being stirred, so as to adjust the solution at pH 6. This took 60 minutes.

The plated silica was separated from the plating solution by suction filtration, washed with pure water, and isolated by suction filtration again. While the silica remained wet, it was transferred to the subsequent step.

Gold Plating of Nickel-plated Silica

The gold plating solution used was 10 g of a gold plating solution K-24N containing cyanoaurate (Kojundo Chemical Laboratory Co,. Ltd.). The silica particles having metallic nickel deposited on their entire surface were dispersed in ion-exchanged water. With vigorous stirring, the gold plating solution was added dropwise to the dispersion. The solution temperature was raised from room temperature to 45° C., and immediately thereafter, the silica turned golden, indicating that the nickel on the silica surface was replaced by gold.

The plated silica particles settled on the bottom and were subjected to filtration, water washing and drying (at 50° C. for 30 minutes) and thereafter, fired at 250° C. for one hour in a hydrogen-purged electric furnace. The resulting silica particles were observed under a stereomicroscope to find that silica particles were covered with gold over their entire surface. On IPC analysis of this silica, palladium, nickel and gold were detected.

Identification of Conductive Silica having Silica-silicon Polymer-nickel/phosphorus Alloy-gold Structure The gold-plated silica was fixedly buried in a resin piece by the microtome technique, which was sliced by a diamond cutter. The cross section was observed under a transmission electron microscope H9000NAR (Hitachi, Ltd.), finding a two-layer structure consisting of a silica portion and a multi-phase plated portion. The constituent elements were analyzed in a depth direction to find a multi-layer structure consisting of a gold layer, a nickel-phosphorus alloy layer, and a silicon layer stacked in the depth direction. With respect to the phosphorus content of the nickel-phosphorus alloy layer, a region of the nickel layer disposed adjacent the silica had a high phosphorus content, and a region of the nickel layer disposed adjacent the gold had a low phosphorus content, indicating that the nickel layer had a graded composition structure.

Figure 3A:
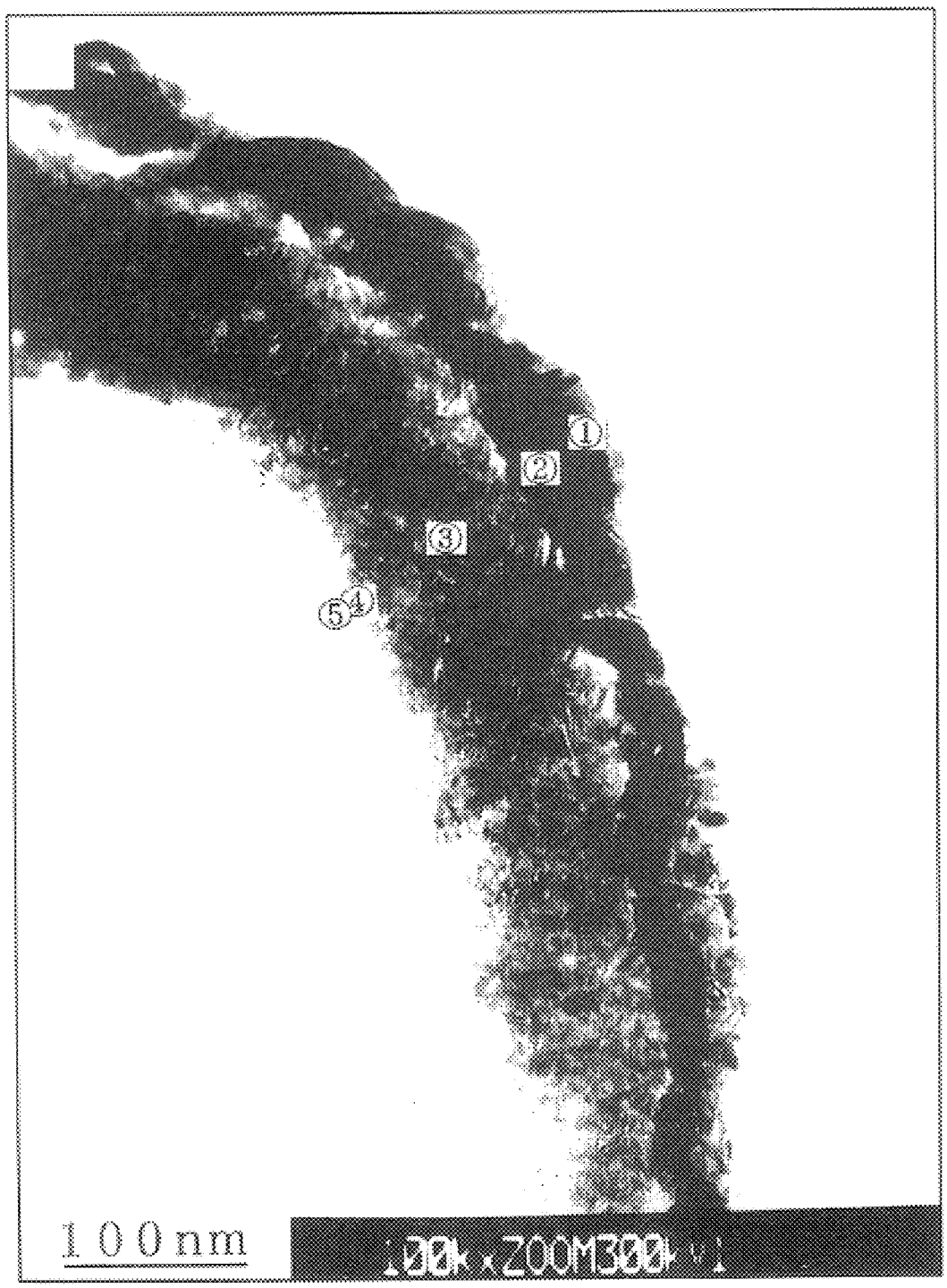
FIGS. 3(A) to 3(C) are cross-sectional photomicrographs of gold-plated silica of Example 4.
Figure 3B:
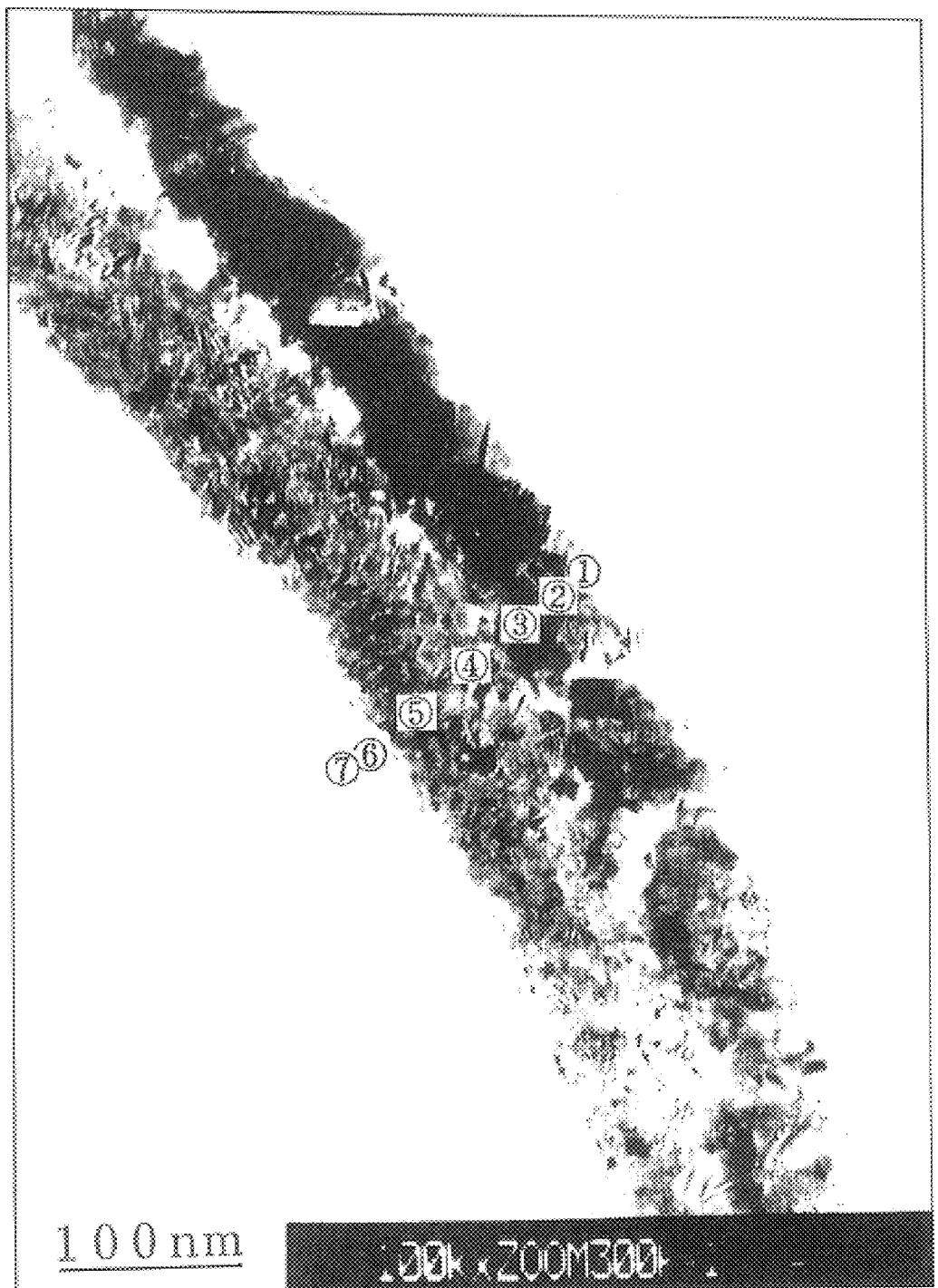
Figure 3C:
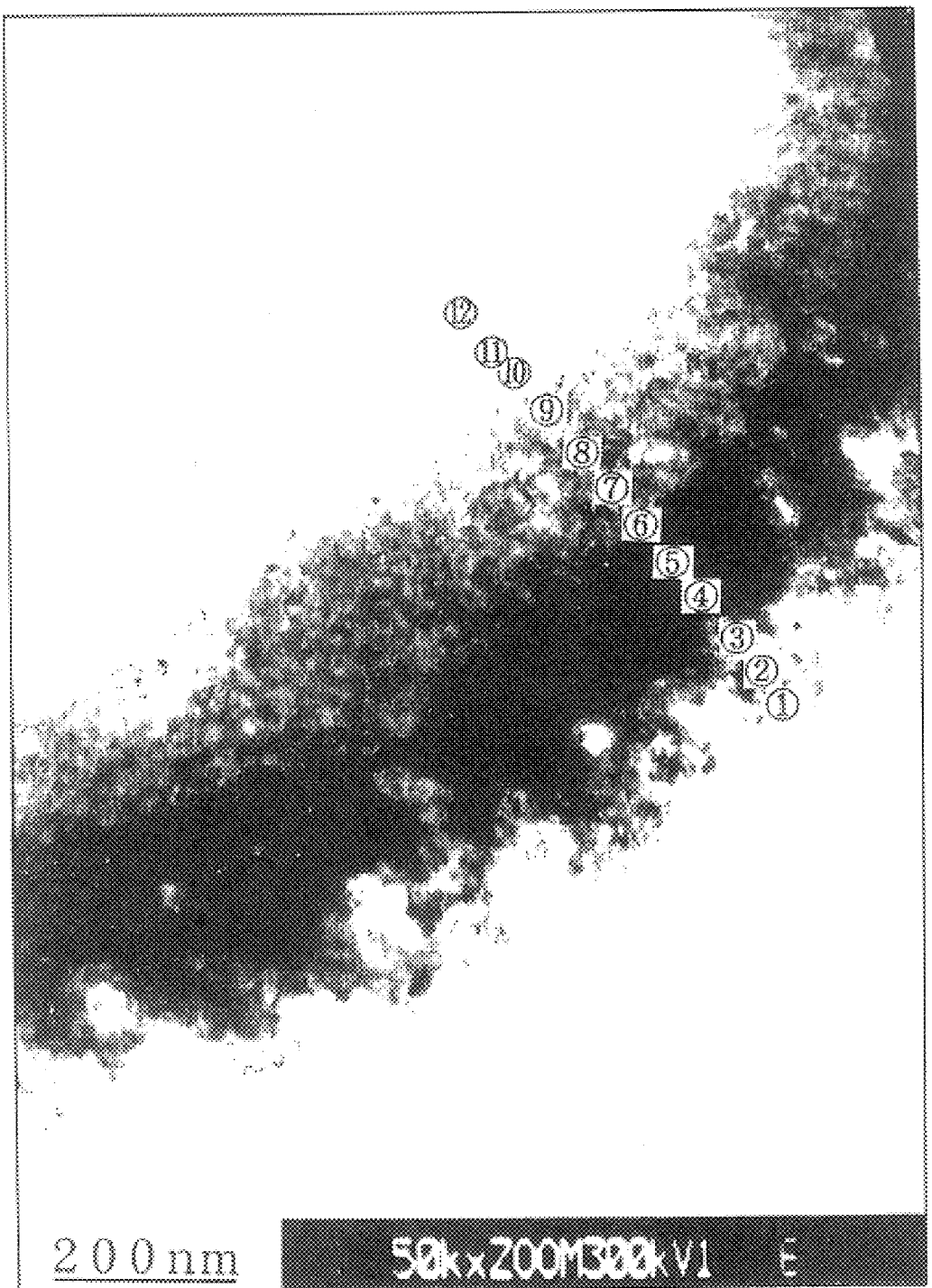

FIGS. 3(A) to 3(C) are cross-sectional photomicrographs on which points of elemental analysis are marked. Table 1 shows the contents (wt %) of Si, P, Ni, and Au at these points of analysis. Table 3 shows the contents (wt %) of P and Ni at these points of analysis.

Properties of Conductive Silica having Silica-silicon Polymer-nickel/phosphorus Alloy-gold Structure The electric resistivity of the gold-plated silica was determined by introducing it into a cylindrical cell having four terminals, conducting a current of 1 mA to 10 mA across the terminals of 0.2 $cm^2$ area at the opposed ends from a current source SMU-257 (Keithley Co.), and measuring a voltage drop across the 0.2 cm spaced apart terminals at the center of the cylinder by means of a nanovolt meter model 2000 (Keithley Co.). The gold-plated silica had a resistivity of 2.2 mΩ-cm. The gold-plated silica was milled in a mortar for one minute and then heat treated at 200° C. for 4 hours whereupon it was examined to find no change of its outer appearance and resistivity.

EXAMPLE 5

Example 4 was repeated except that in the nickel plating step, the palladium colloid-deposited silica was dispersed in a mixture of a nickel plating reducing agent solution and a nickel metal salt solution whereupon nickel plating reaction took place. A cross section of the gold-plated silica was similarly observed, finding a multi-layer structure consisting of a gold layer, a nickel-phosphorus alloy layer, and a silicon layer. The constituent elements were analyzed in a depth direction to find that the nickel-phosphorus alloy layer had an approximately equal phosphorus content of about 12 to 16 wt % in a depth direction, indicating that no graded structure was formed.

Figure 4A:
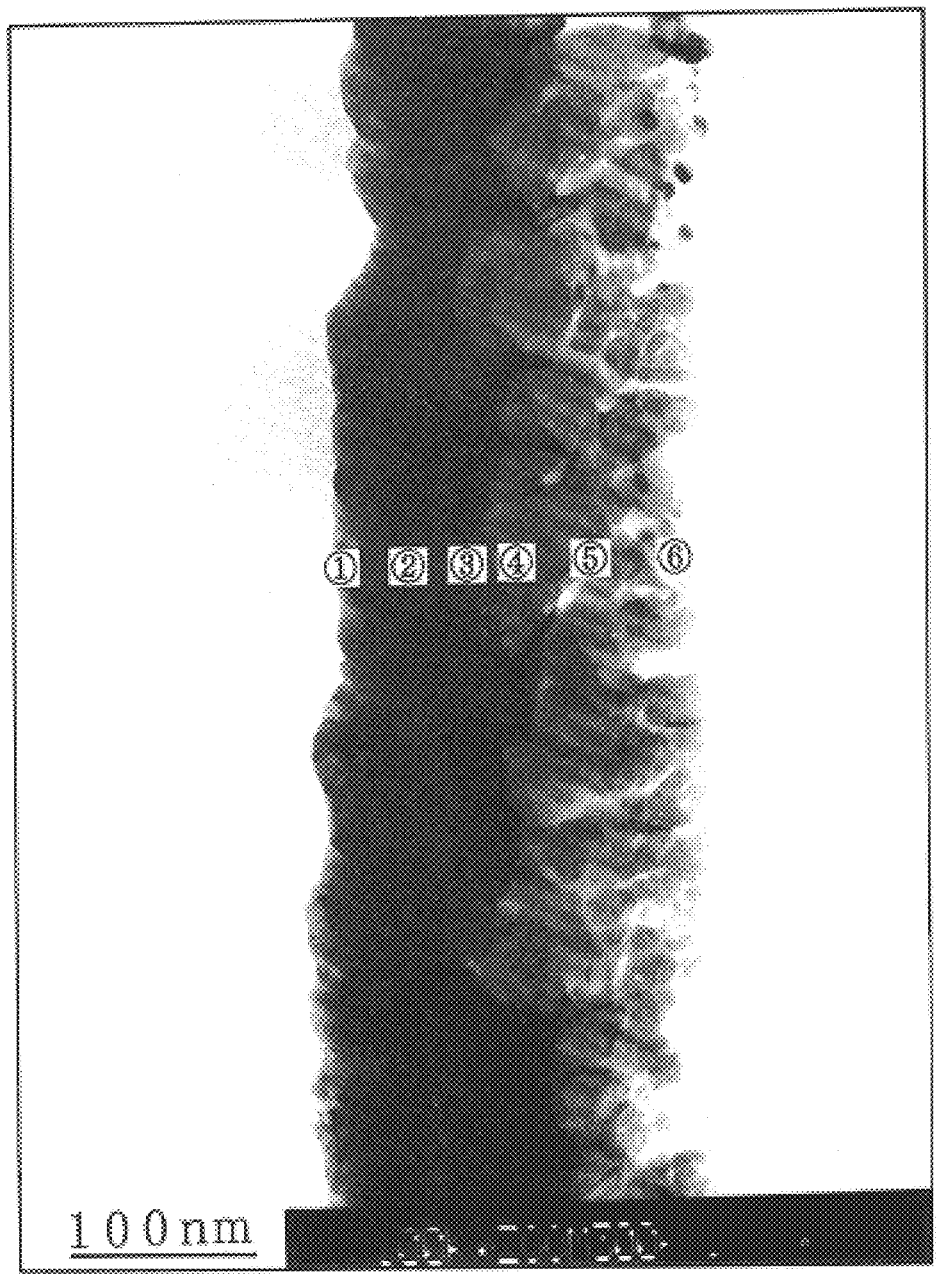
FIGS. 4(A) to 4(C) are cross-sectional photomicrographs of gold-plated silica of Example 5.
Figure 4B:
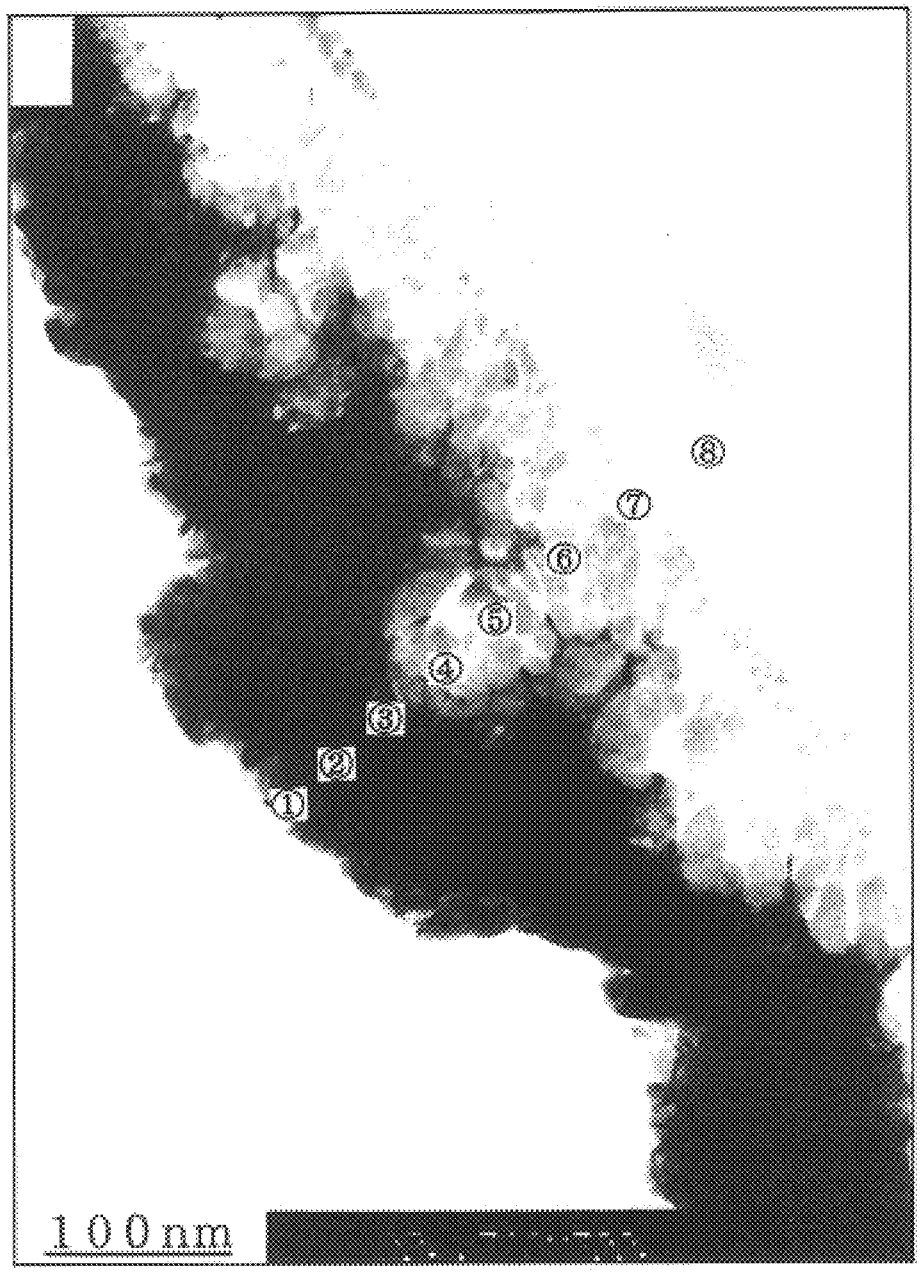
Figure 4C:
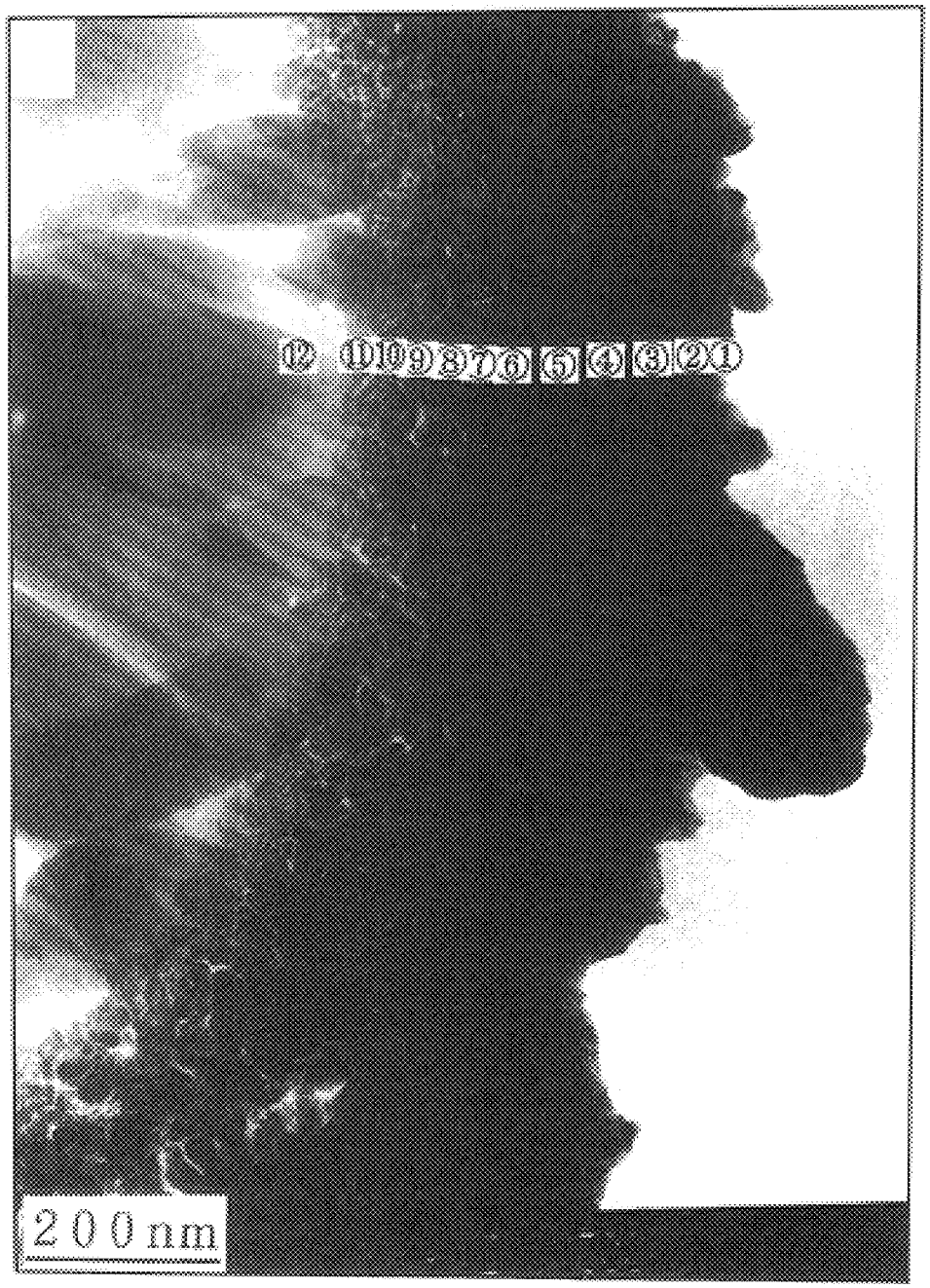

FIGS. 4(A) to 4(C) are cross-sectional photomicrographs on which points of elemental analysis are marked. Table 2 shows the contents (wt %) of Si, P, Ni, and Au at these points of analysis. Table 3 shows the contents (wt %) of P and Ni at these points of analysis.

The gold-plated silica had an initial resistivity of 4.5 mΩ-cm. The gold-plated silica was milled in a mortar for one minute and then heat treated at 200° C. for 4 hours whereupon it was observed. Because of metal peeling, the outer appearance became brown and the resistivity rose to 75 mΩ-cm.

EXAMPLE 6

Preparation of Palladium Colloid-deposited Silica

The PPHS-treated silica of Example 4 would float on the surface of water since it was hydrophobicized. 100 g of the PPHS-treated spherical silica was admitted into 50 g of a 0.5% aqueous solution of sodium dodecylbenzenesulfonate as a surfactant. By agitation, the silica was dispersed in water within a short time of about 5 minutes.

For palladium treatment, 70 g of a 1% $PdCl_2$ aqueous solution (0.7 g of palladium chloride, 0.4 g of palladium) was added to 150 g of the silica-water dispersion, followed by 30 minutes of agitation, filtration and water washing. By this treatment, palladium colloid adhered to the silica surface, and so the silica was colored blackish gray. The palladium colloid-deposited silica was isolated by filtration, washed with water, and immediately subjected to plating.

Preparation of Copper-plated Silica

The copper plating solution used was 100 g of a dilution obtained by diluting an electroless copper plating solution C-200LTA/LTB (Koujundo Kagaku Kenkyuujo) with an equal volume of ion-exchanged water. The palladium colloid-deposited silica particles were dispersed in the copper plating solution along with 0.5 g of anti-foaming surfactant KS-538 (Shin-Etsu Chemical Co., Ltd.). With vigorous stirring, the solution temperature was raised from room temperature to 35° C. Fine bubbles evolved and the silica turned reddish brown, indicating that metallic copper deposited on the silica surface.

The plated silica particles settled on the bottom and were subjected to filtration, water washing and drying (at 50° C. for 30 minutes) and thereafter, fired at 300° C. for one hour in a nitrogen-purged electric furnace. The resulting silica particles were observed under a stereomicroscope to find that silica particles were covered with copper over their entire surface.

EXAMPLE 7

The sodium dodecylbenzenesulfonate surfactant was omitted, 100 g of the PPHS-treated spherical silica of Example 4 was admitted into 150 g of water, and vigorous agitation was continued over 30 minutes for dispersion. For palladium treatment, 70 g of a 1% $PdCl_2$ aqueous solution (0.7 g of palladium chloride, 0.4 g of palladium) was added to 250 g of the silica-water dispersion, followed by 30 minutes of agitation, filtration and water washing. By this treatment, palladium colloid adhered to the silica surface, and so the silica was colored blackish gray.

The palladium colloid-deposited silica was isolated by filtration, washed with water, and immediately subjected to plating in the presence of surfactant KS-538 as in Example 6. The resultant copper-plated silica had a firmly bonded metal film.

EXAMPLE 8
Preparation of Palladium Colloid-deposited Silica 100 g of the PPHS-treated spherical silica of Example 4 was admitted into 50 g of a 0.5% aqueous solution of sodium dodecylbenzenesulfonate as a surfactant. By agitation, the silica was dispersed in water within a short time of about 5 minutes. For palladium treatment, 70 g of a 1% $PdCl_2$ aqueous solution (0.7 g of palladium chloride, 0.4 g of palladium) was added to 150 g of the silica-water dispersion, followed by 30 minutes of agitation, filtration and water washing. By this treatment, palladium colloid adhered to the silica surface, and so the silica was colored blackish gray. The palladium colloid-deposited silica was isolated by filtration, washed with water, and immediately subjected to plating.

Preparation of Nickel-plated Silica

The nickel plating solution used was 100 g of a dilution obtained by diluting an electroless nickel plating solution Ni-901 (Koujundo Kagaku Kenkyuujo) with a five-fold volume of ion-exchanged water. The palladium colloid-deposited silica particles were dispersed in the nickel plating solution along with 0.5 g of anti-foaming surfactant KS-538 (Shin-Etsu Chemical Co., Ltd.). With vigorous stirring, the solution temperature was raised from room temperature to 65° C. Fine bubbles evolved and the silica turned black, indicating that metallic nickel deposited on the silica surface.

Preparation of Gold-plated Silica (1)

The gold plating solution used was 100 g of an electroless gold plating solution K-24N (Koujundo Kagaku Kenkyuujo) without dilution. The silica particles having metallic nickel deposited on their entire surface were dispersed in the gold plating solution. With vigorous stirring, the solution temperature was raised from room temperature to 95° C. Immediately thereafter, fine bubbles evolved and the silica turned golden, indicating that gold deposited on the silica surface.

The plated silica particles settled on the bottom and were subjected to filtration, water washing and drying (at 50° C. for 30 minutes) and thereafter, fired at 500° C. for one hour in a nitrogen-purged electric furnace. The resulting silica particles were observed under a stereomicroscope to find that silica particles were covered with gold over their entire surface. On IPC analysis of this silica, palladium, nickel and gold were detected.

EXAMPLE 9
Preparation of Gold colloid-deposited Silica 100 g of the PPHS-treated silica of Example 6 was admitted into 50 g of a 0.5% aqueous solution of sodium dodecylbenzenesulfonate as a surfactant. By agitation, the silica was dispersed in water within a short time of about 5 minutes. For gold treatment, 70 g of a 3% $NaAuCl_4$ aqueous solution (2.1 g of sodium chloroaurate) was added to 150 g of the silica-water dispersion, followed by 30 minutes of agitation, filtration and water washing. By this treatment, gold colloid adhered to the silica surface, and so the silica was colored light purple. The gold colloid-deposited silica was isolated by filtration, washed with water, and immediately subjected to plating.

Preparation of Gold-plated Silica (2)

The gold colloid-deposited silica was dispersed in the above electroless gold plating solution along with 0.5 g of anti-foaming surfactant KS-538 (Shin-Etsu Chemical Co., Ltd.). With vigorous stirring, the solution temperature was raised from room temperature to 85° C. Immediately thereafter, fine bubbles evolved and the silica turned golden, indicating that gold deposited on the silica surface.

The plated silica particles settled on the bottom and were subjected to filtration, water washing and drying (at 50° C. for 30 minutes) and thereafter, fired at 500° C. for one hour in a nitrogen-purged electric furnace. The resulting silica particles were observed under a stereomicroscope to find that silica particles were covered with gold over their entire surface. On IPC analysis of this silica, only gold was detected, but other elements such as palladium, nickel and copper were not detected.

EXAMPLE 10
Preparation of Palladium Colloid-deposited Silica 100 g of the PPHS-treated spherical silica of Example 6 was admitted into 50 g of a 0.5% aqueous solution of surfactant Surfynol 504 (Nisshin Chemical Industry K.K.). By agitation, the silica was dispersed in water within a short time of about 5 minutes. For palladium treatment, 70 g of a 1% $PdCl_2$ aqueous solution (0.7 g of palladium chloride, 0.4 g of palladium) was added to 150 g of the silica-water dispersion, followed by 30 minutes of agitation, filtration and water washing. By this treatment, palladium colloid adhered to the silica surface, and so the silica was colored blackish gray. The palladium colloid-deposited silica was isolated by filtration, washed with water, and immediately subjected to plating.

Nickel Plating of Palladium Colloid-deposited Silica

The reducing solution used for nickel plating was 100 g of a mixture of 2.0 M sodium hypophosphite, 1.0 M sodium acetate and 0.5 M glycine, diluted with ion-exchanged water. The palladium colloid-deposited silica was dispersed in the nickel plating, reducing solution along with 0.5 g of anti-foaming agent KS-538 (Shin-Etsu Chemical Co., Ltd.).

With vigorous stirring, the solution temperature was raised from room temperature to 65° C. A dilution of 2.0 M sodium hydroxide in ion-exchanged water was carried by air and added dropwise, and at the same time, a dilution of 1.0 M nickel sulfate in ion-exchanged water was carried by nitrogen gas and added dropwise to the reducing solution. Then fine bubbles evolved and the silica turned black, indicating that metallic nickel deposited on the silica surface. The silica particles had metallic nickel deposited on their entire surface, with no agglomerates or bulbous deposits found.
Gold Plating of Nickel-plated Silica The gold plating solution used was 100 g of a gold plating solution K-24N (Koujundo Kagaku Kenkyuujo) without dilution. The silica particles having metallic nickel deposited on their entire surface were dispersed in the gold plating solution. With vigorous stirring, the solution temperature was raised from room temperature to 95° C. Immediately thereafter, fine bubbles evolved and the silica turned golden, indicating that gold deposited on the silica surface.

The plated silica particles settled on the bottom and were subjected to filtration, water washing and drying (at 50° C. for 30 minutes) and thereafter, fired at 300° C. for one hour in a hydrogen-purged electric furnace. The resulting silica particles were observed under a stereomicroscope to find that silica particles were covered with gold over their entire surface. On IPC analysis of this silica, palladium, nickel and gold were detected.
Identification of Conductive Silica having Silica-silicon Polymer-nickel-gold Structure The gold-plated silica was mixed with an epoxy resin (Araldite A/B), which was cured and sliced. A slice was observed under an electron microscope, finding a two-layer structure consisting of a silica portion and a multi-phase plated portion.

The gold-plated silica was analyzed by Auger electron spectroscopy, by which constituent elements were analyzed in a depth direction while ion etching the surface. The silica particles were found to have a four-layer structure consisting of a gold layer, a nickel layer, a silicon polymer layer (carbon and silicon-containing layer) and a silica layer stacked in the depth direction. The silica particles had a yellow outer appearance when observed under a microscope, and a specific gravity of 3.5. The gold layer was 0.03 μm thick, the nickel layer was 0.25 μm thick, and the silicon polymer layer was 0.1 μm thick.
Properties of Conductive Silica having Silica-silicon Polymer-nickel-gold Structure The electric resistivity of the gold-plated silica was determined by introducing it into a cylindrical cell having four terminals, conducting a current of 1 mA to 10 mA across the terminals of 0.2 cm$^2$ area at the opposed ends from a current source SMU-257 (Keithley Co.), and measuring a voltage drop across the 0.2 cm spaced apart terminals at the center of the cylinder by means of a nanovolt meter model 2000 (Keithley Co.). The gold-plated silica had a resistivity of 2.2 mΩ-cm. The gold-plated silica was milled in a mortar for one minute and then heat treated at 200° C. for 4 hours whereupon it was examined to find no change of its outer appearance and resistivity.

For comparison purposes, in the step of nickel plating on the palladium colloid-deposited silica, neither nitrogen gas nor air was used. At the end of plating reaction, agglomerates and bulbous deposits were found. This gold-plated silica had an initial resistivity of 3.2 mΩ-cm. The silica was milled in a mortar for one minute and then heat treated at 200° C. for 4 hours whereupon it was examined. Metal peeling occurred, the outer appearance turned brown, and the resistivity increased to 75 mΩ-cm.

EXAMPLE 11 and Comparative Example 4

Spherical silica (Admafine SO-25H) was treated by either of the following procedures 1 and 2 using the polysilane obtained in Synthetic Example 2 and methylhydrogenpolysiloxane of the following formula.
Procedure 1

Silica was admitted into a 5% THF solution of the polysilane. After one hour, the silica was collected by filtration and dried.
Procedure 2

Silica was admitted into a 5% toluene solution of the polysiloxane. After one hour, the silica was collected by filtration and dried.

By this treatment, the silica was hydrophobicized so that it would float on the surface of water when poured therein.

Then, 200 parts by weight of a 1% PdCl$_2$ aqueous solution (2 parts by weight of palladium chloride, 1.2 parts by weight of palladium) was added to 100 parts by weight of the silica. Water was evaporated in air to dryness. By this treatment, palladium was borne on the silica, which was colored reddish brown or blackish gray.

The palladium-bearing silica was poured into an electroless copper plating solution which was obtained by diluting an electroless copper plating solution C-200LTA/LTB (Koujundo Kagaku Kenkyuujo) with an equal volume of ion-exchanged water. Immediately after pouring, the silica remained afloat on the surface. After about 5 minutes, bubbling started and the silica submerged and settled on the bottom. At this point, both the solution and the silica became pitch-black. The silica was collected by filtration and dried. Both the silica treated with the polysilane by Procedure 1 and the silica treated with the polysiloxane by Procedure 2 were silica particles covered with a reddish brown copper film on their surface.

For comparison purposes, untreated silica was poured into the same electroless copper plating solution. The silica settled on the bottom and changed no longer. The silica was collected by filtration and dried, yielding a white powder in which there was admixed a blue-green color which was presumed to be copper sulfate.

The above treated silica was treated in a mixed acid of hydrofluoric acid (HF/HClO$_4$) at 300° C. to remove the silicon value. Thereafter, the metal components were re-dissolved with nitric acid. Pd and Cu were quantitatively determined by ICP analysis (Shimadzu ICPS-1000). The results are shown below.

Polysilane-treated silica:
Pd 1,410 ppm, Cu 9.4 wt %
Polysiloxane-treated silica:
Pd 600 ppm, Cu 4.0 wt %
Untreated silica:
Pd undetected, Cu 0.02 wt %

BENEFITS OF THE INVENTION

There has been described a metallized powder possessing a stronger bond between the particle base and the metal even at elevated temperature and exhibiting high conductivity, heat resistance, and conductivity stability. The conductive powder is blended in a rubber composition to provide a conductive rubber composition, from which conductive rubber parts possessing high conductivity despite a low specific gravity and having conductivity stability even at elevated temperature are obtained. The conductive rubber parts may be used as reliable connectors and gaskets.

Japanese Patent Application Nos. 11-132501 and 11-193354 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A conductive powder comprising particles each having a surface, an organic silicon polymer layer formed on the particle surface, and a metal layer enclosing the organic silicon polymer layer.

2. A conductive powder comprising particles each having a surface, a partially or entirely ceramic layer formed from an organic silicon polymer on the particle surface, and a metal layer enclosing the ceramic layer.

3. The conductive powder of claim 1 or 2 wherein said metal layer includes a first metal layer and a second metal layer enclosing the first metal layer.

4. The conductive powder of claim 3 wherein said first metal layer is selected from the group consisting of nickel, copper, silver, cobalt, tungsten, iron and zinc, and said second metal layer is selected from the group consisting of gold, platinum, and palladium.

5. The conductive powder of claim 4 wherein said first metal layer is nickel, and said second metal layer is gold.

6. The conductive powder of claim 3 wherein said particles are of silica.

7. The conductive powder of claim 3, wherein the first metal layer has a thickness of 0.1 to 2.0 μm and the second metal layer has a thickness of 0.01 to 0.1 μm.

8. The conductive powder of claim 1 or 2 wherein the silicon polymer layer is made of an organic silicon polymer having reducing effect.

9. The conductive powder of claim 8 wherein the reducing silicon polymer is selected from the group consisting of a polysilane, polycarbosilane, polysiloxane, and polysilazane having Si—Si bonds and/or Si—H bonds.

10. The conductive powder of claim 9 wherein said polysilane is represented by the following general formula (1):

$(R^1{}_m R^2{}_n X_p Si)_q$  (1)

wherein $R^1$ and $R^2$ each are hydrogen or a substituted or unsubstituted monovalent hydrocarbon group; X is a group as defined for $R^1$, alkoxy group, halogen atom, oxygen atom or nitrogen atom; m, n and p are numbers satisfying $0.1 \leq m \leq 2$, $0.1 \leq n \leq 1$, $0 \leq p \leq 0.5$, and $1 \leq m+n+p \leq 2.5$, and q is an integer of $4 \leq q \leq 100,000$.

11. The conductive powder of claim 9 wherein said polysiloxane is represented by the following general formula (2):

$(R^3{}_a R^4{}_b H_c SiO_d)_e$  (2)

wherein $R^3$ and $R^4$ each are hydrogen, a substituted or unsubstituted monovalent hydrocarbon group, alkoxy group or halogen atom; a, b, c and d are numbers satisfying $0.1 \leq a \leq 2$, $0 \leq b \leq 1$, $0.01 \leq c \leq 1$, $0.5 \leq d \leq 1.95$, and $2 \leq a+b+c+d \leq 3.5$, and e is an integer of $2 \leq e \leq 100,000$.

12. A conductive powder comprising particles each having a surface, and an organic silicon polymer layer, a nickel-phosphorus alloy layer, and a gold layer formed successively on the particle surface, wherein said nickel-phosphorus alloy layer has a phosphorus content which differs between inner and outer surface regions.

13. The conductive powder of claim 12, wherein the inner surface region of the nickel-phosphorus alloy layer has a high phosphorus content and the outer surface region of the nickel-phosphorus alloy layer has a low phosphorus content.

14. The conductive powder of claim 13, wherein the inner surface region of the nickel-phosphorus alloy layer has a phosphorus content of 5 to 20% by weight and the outer surface region of the nickel-phosphorus alloy. layer has a phosphorus content of 0.5 to 8% by weight.

15. A conductive powder comprising particles each having a surface, and a partially or entirely ceramic layer of an organic silicon polymer, a nickel-phosphorus alloy layer, and a gold layer formed successively on the particle surface, wherein said nickel-phosphorus alloy layer has a phosphorus content which differs between inner and outer surface regions.

16. The conductive powder of claim 15, wherein the inner surface region of the nickel-phosphorus alloy layer has a high phosphorus content and the outer surface region of the nickel-phosphorus alloy layer has a low phosphorus content.

17. The conductive powder of claim 16, wherein the inner surface region of the nickel-phosphorus alloy layer has a phosphorus content of 5 to 20% by weight and the outer surface region of the nickel-phosphorus alloy layer has a phosphorus content of 0.5 to 8% by weight.

* * * * *